(12) United States Patent
Matsuo et al.

(10) Patent No.: US 12,537,530 B2
(45) Date of Patent: *Jan. 27, 2026

(54) VIBRATING ELEMENT INCLUDING QUARTZ CRYSTAL SUBSTRATE AND EXCITATION ELECTRODES, AND OSCILLATOR INCLUDING VIBRATING ELEMENT

(71) Applicant: SEIKO EPSON CORPORATION, Tokyo (JP)

(72) Inventors: Atsushi Matsuo, Shiojiri (JP); Ryuta Nishizawa, Nagano (JP)

(73) Assignee: SEIKO EPSON CORPORATION, Tokyo (JP)

( * ) Notice: Subject to any disclaimer, the term of this patent is extended or adjusted under 35 U.S.C. 154(b) by 1002 days.

This patent is subject to a terminal disclaimer.

(21) Appl. No.: 17/677,242

(22) Filed: Feb. 22, 2022

(65) Prior Publication Data

US 2022/0271758 A1 Aug. 25, 2022

(30) Foreign Application Priority Data

Feb. 25, 2021 (JP) ................. 2021-028265

(51) Int. Cl.
*H03L 1/02* (2006.01)
*H03H 9/19* (2006.01)
*H03L 1/04* (2006.01)

(52) U.S. Cl.
CPC ............. *H03L 1/026* (2013.01); *H03H 9/19* (2013.01); *H03L 1/022* (2013.01); *H03L 1/04* (2013.01)

(58) Field of Classification Search
CPC .. H03H 9/19; H03L 1/026; H03L 1/04; H03L 1/022
See application file for complete search history.

(56) References Cited

U.S. PATENT DOCUMENTS

| 5,214,668 | A | 5/1993 | Satou et al. |
| 5,319,324 | A | 6/1994 | Satoh et al. |
| 8,179,201 | B2 | 5/2012 | Lander |
| 8,504,164 | B2 | 8/2013 | Karr |
| 11,070,169 | B2 * | 7/2021 | Nishizawa ............... H03B 5/04 |
| 11,108,377 | B2 * | 8/2021 | Ikeda .................. H03H 9/1035 |
| 11,722,098 | B2 * | 8/2023 | Matsuo ............... H03H 9/1021 |
| | | | 331/66 |

FOREIGN PATENT DOCUMENTS

| JP | 04-363913 | 12/1992 |
| JP | H6-21741 A | 1/1994 |
| JP | 2002-26658 A | 1/2002 |
| JP | 2013-098841 | 5/2013 |
| JP | 2014-33368 A | 2/2014 |

* cited by examiner

*Primary Examiner* — Emily P Pham
(74) *Attorney, Agent, or Firm* — Rankin, Hill & Clark LLP

(57) ABSTRACT

A vibrating element includes a quartz crystal substrate having a first vibrating portion having a pair of first excitation electrodes, a second vibrating portion having a pair of second excitation electrodes, and a third vibration portion having a pair of third excitation electrodes, in which at least one second excitation electrode of the pair of second excitation electrodes is formed into a first inclined surface inclined with respect to both main surfaces of the quartz crystal substrate, and at least one third excitation electrode of the pair of third excitation electrodes is formed into a second inclined surface inclined with respect to both the main surfaces and the first inclined surface.

16 Claims, 19 Drawing Sheets

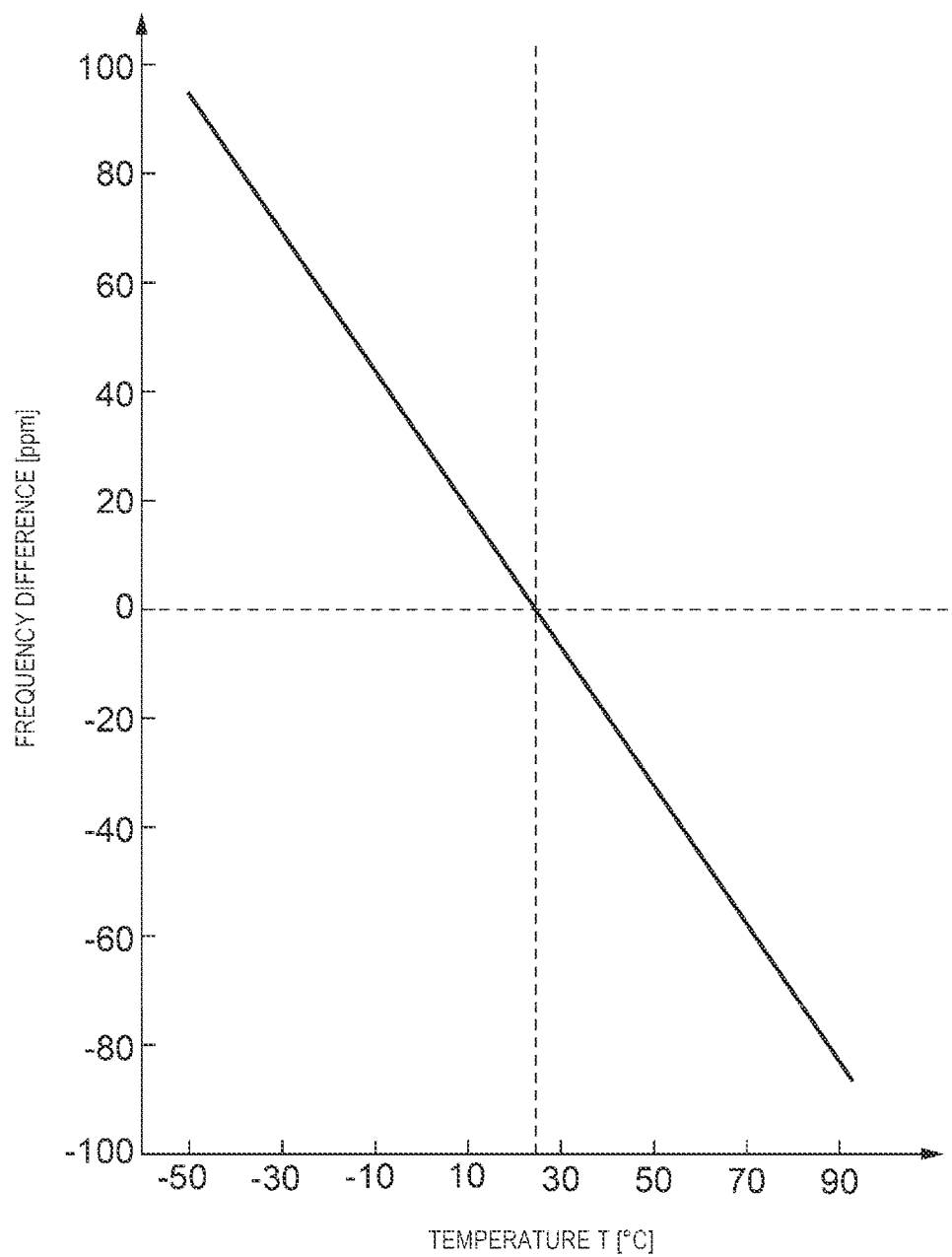

VIBRATING ELEMENT INCLUDING QUARTZ CRYSTAL SUBSTRATE AND EXCITATION ELECTRODES, AND OSCILLATOR INCLUDING VIBRATING ELEMENT

The present application is based on, and claims priority from JP Application Serial Number 2021-028265, filed Feb. 25, 2021, the disclosure of which is hereby incorporated by reference herein in its entirety.

BACKGROUND

1. Technical Field

The present disclosure relates to a vibrating element and an oscillator.

2. Related Art

A Temperature Compensated Crystal Oscillator (TCXO) including a temperature detecting element and a temperature compensated circuit is widely used for the purpose of obtaining a stable frequency signal over a wide temperature range. However, since the TCXO separately includes a vibrating element made of quartz crystal and a temperature detecting element, a detection error occurs between a temperature detected by the temperature detecting element and a temperature of the vibrating element, so that it is difficult to perform highly accurate temperature compensation.

Therefore, as shown in JP-A-2013-98841, a vibrating element is disclosed which is provided with a first vibrating portion for oscillation signal output and a second vibrating portion for temperature detection on a common piezoelectric plate. Since the two vibrating portions are formed on the common piezoelectric plate, heat is rapidly transferred between the first vibrating portion and the second vibrating portion. Therefore, as compared with a case where the vibrating element and the temperature detecting element are separately included, a detection error becomes small between a temperature detected by the second vibrating portion for temperature detection and a temperature of the first vibrating portion for oscillation signal output, so that it is possible to perform highly accurate temperature compensation.

However, in the vibrating element described in JP-A-2013-98841, an excitation electrode for oscillation signal output and an excitation electrode for temperature detection are formed on a surface on which a cutting angle of the piezoelectric plate is the same, so that the first vibrating portion for oscillation signal output and the second vibrating portion for temperature detection have the same frequency-temperature characteristic. Since the first vibrating portion for oscillation signal output is set to the cutting angle so that a frequency change becomes small with respect to a temperature change, the second vibrating portion for temperature detection also has a frequency-temperature characteristic in which a frequency change is small with respect to the temperature change, so that there is a problem in that a resolution of the temperature change with respect to the frequency change is low and accurate temperature detection cannot be performed.

SUMMARY

A vibrating element includes: a quartz crystal substrate having a first vibrating portion, a second vibrating portion disposed on one side of the first vibrating portion in a first direction, and a third vibrating portion disposed on one side of the first vibrating portion in the first direction and aligned with the second vibrating portion along a second direction orthogonal to the first direction; a pair of first excitation electrodes formed on both main surfaces of the quartz crystal substrate in the first vibrating portion; a pair of second excitation electrodes formed to sandwich the second vibrating portion in a thickness direction of the quartz crystal substrate in the second vibrating portion; and a pair of third excitation electrodes formed to sandwich the third vibrating portion in the thickness direction of the quartz crystal substrate in the third vibrating portion, in which at least one second excitation electrode of the pair of second excitation electrodes is formed into a first inclined surface inclined with respect to both the main surfaces, at least one third excitation electrode of the pair of third excitation electrodes is formed into a second inclined surface inclined with respect to both the main surfaces, and the second inclined surface is inclined with respect to the first inclined surface.

An oscillator includes: the above-described vibrating element; a first oscillation circuit that is electrically coupled to a first excitation electrode to output a first oscillation signal; a second oscillation circuit that is electrically coupled to a second excitation electrode to output a second oscillation signal; a third oscillation circuit that is electrically coupled to a third excitation electrode to output a third oscillation signal; and a control signal output circuit to which at least one of the second oscillation signal and the third oscillation signal is input and that outputs a control signal for controlling an oscillation frequency of the first oscillation signal based on the input signal.

BRIEF DESCRIPTION OF THE DRAWINGS

FIG. 31 is a diagram showing an example of a relationship between a difference in a frequency change amount of the vibrating element and a temperature.

DESCRIPTION OF EXEMPLARY EMBODIMENTS

First Embodiment 1.1. Vibrating Element

First, a schematic configuration of a vibrating element 1 according to a first embodiment will be described with reference to FIGS. 1, 2, and 3.

Also, a Y' axis and a Z' axis in FIGS. 1 to 4 and 7 to 26 below are axes obtained by rotating a Y axis and a Z axis around an X axis by a predetermined angle among the X axis, the Y axis, and the Z axis that are orthogonal to each other. Further, a direction along the X axis is referred to as an "X direction", a direction along the Y' axis is referred to as a "Y' direction", and a direction along the Z' axis is referred to as a "Z' direction". Further, in the present embodiment, the X direction corresponds to a first direction, and the Z' direction corresponds to a second direction.

Figure 1:
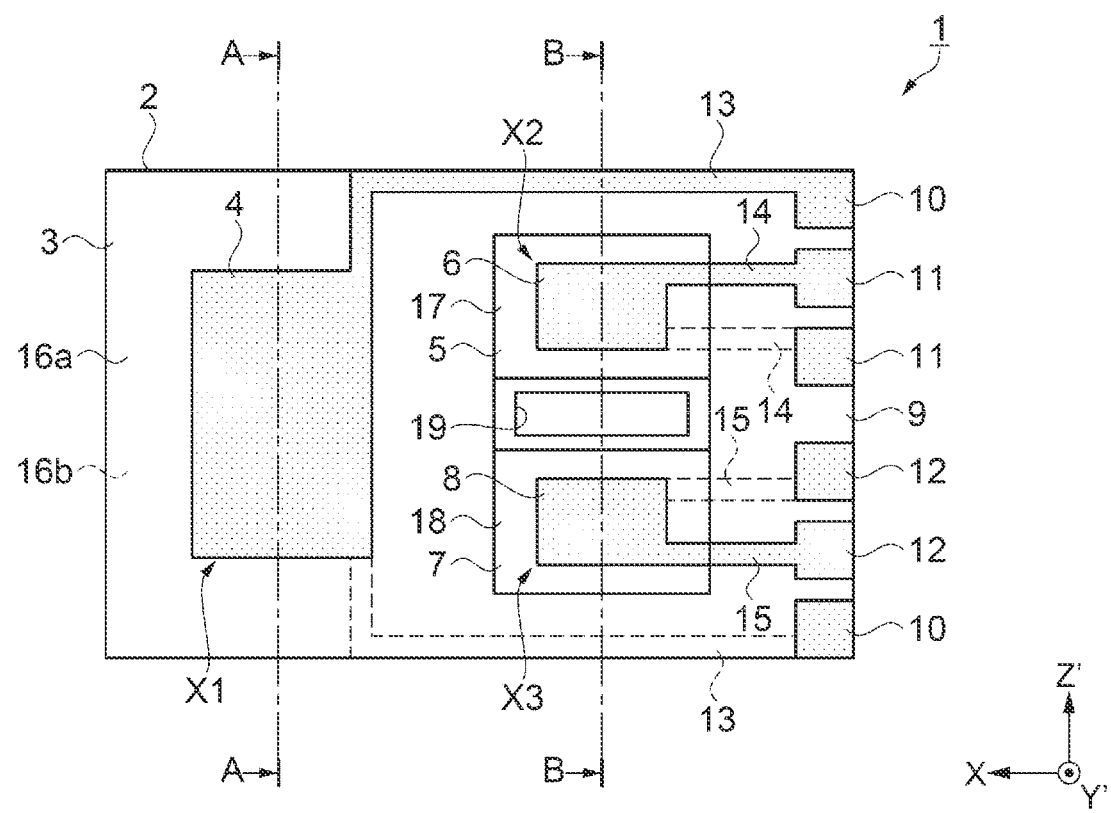
FIG. 1 is a plan diagram showing a vibrating element according to a first embodiment.

As shown in FIG. 1, the vibrating element 1 according to the present embodiment includes a quartz crystal substrate 2 having a first vibrating portion 3, a second vibrating portion 5, and a third vibrating portion 7, a first excitation electrode 4 formed on the first vibrating portion 3, a second excitation electrode 6 formed on the second vibrating portion 5, a third excitation electrode 8 formed on the third vibrating portion 7, terminals 10, 11, and 12 formed in a fixing portion 9, a lead electrode 13 for conductively coupling the first excitation electrode 4 to the terminal 10, a lead electrode 14 for conductively coupling the second excitation electrode 6 to the terminal 11, and a lead electrode 15 for conductively coupling the third excitation electrode 8 to the terminal 12.

The vibrating element 1 includes a first vibrating element X1, a second vibrating element X2, and a third vibrating element X3. The first vibrating element X1 has the first vibrating portion 3 formed with a pair of first excitation electrodes 4. The second vibrating element X2 has the second vibrating portion 5 formed with a pair of second excitation electrodes 6. The third vibrating element X3 has the third vibrating portion 7 formed with a pair of third excitation electrodes 8. Since the first vibrating element X1, the second vibrating element X2, and the third vibrating element X3 share the quartz crystal substrate 2, thereby having a structure in which heat from the outside is easily transmitted evenly.

The quartz crystal substrate 2 includes the first vibrating portion 3, the second vibrating portion 5 disposed on one side of the first vibrating portion 3 in the X direction as the first direction, the third vibrating portion 7 disposed on one side of the first vibrating portion 3 in the X direction and is aligned with the second vibrating portion 5 along the Z' direction as the second direction orthogonal to the X direction, and the fixing portion 9 for fixing the quartz crystal substrate 2 to a package (not shown) or the like. The quartz crystal substrate 2 is a flat plate which has an XZ' surface as a main surface, a first main surface 16a, and a second main surface 16b parallel to the first main surface 16a, and has the Y' direction as a thickness direction.

The first vibrating portion 3, the second vibrating portion 5, the third vibrating portion 7, and the fixing portion 9 are disposed to be aligned in the X direction. The fixing portion 9 is disposed at an end portion of the quartz crystal substrate 2 in the X direction, that is, an end portion on a side of the second vibrating portion 5 and the third vibrating portion 7. That is, the first vibrating portion 3 and the fixing portion 9 are disposed to be separated from each other while sandwiching the second vibrating portion 5 and the third vibrating portion 7 therebetween. Therefore, distortion, which is generated when the quartz crystal substrate 2 is fixed to the package or the like, is difficult to be transmitted to the first vibrating portion 3.

Figure 2:
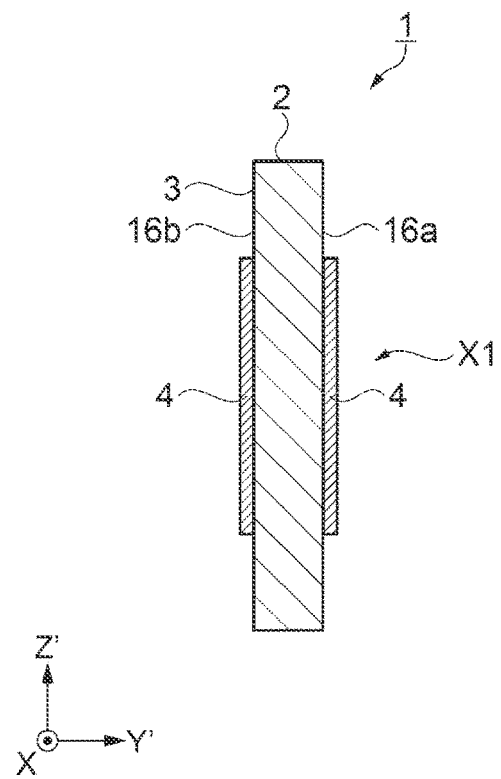
FIG. 2 is a cross-sectional diagram taken along a line A-A in FIG. 1.

As shown in FIG. 2, the first vibrating portion 3 includes the first main surface 16a of the quartz crystal substrate 2 and the second main surface 16b parallel to the first main surface 16a. A pair of first excitation electrodes 4 are formed on the first main surface 16a and the second main surface 16b of the first vibrating portion 3 so as to sandwich the first vibrating portion 3 in the thickness direction of the quartz crystal substrate 2. The first excitation electrode 4 on a side of the first main surface 16a and the first excitation electrode 4 on a side of the second main surface 16b are disposed to overlap each other in plan view from the Y' direction. The first main surface 16a and the second main surface 16b correspond to both the main surfaces.

Figure 3:
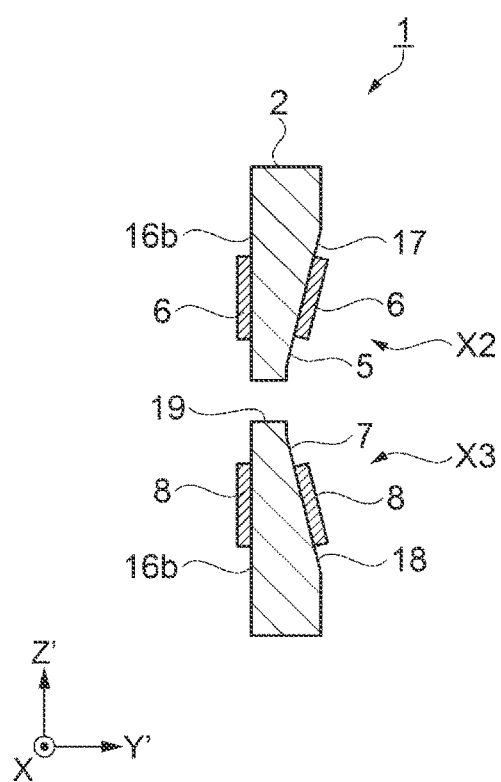
FIG. 3 is a cross-sectional diagram taken along a line B-B in FIG. 1.

As shown in FIG. 3, the second vibrating portion 5 includes a first inclined surface 17 and the second main surface 16b of the quartz crystal substrate 2. A pair of second excitation electrodes 6 are formed on the first inclined surface 17 and the second main surface 16b of the second vibrating portion 5 so as to sandwich the second vibrating portion 5 in the thickness direction of the quartz crystal substrate 2. The second excitation electrode 6 on a side of the first inclined surface 17 and the second excitation electrode 6 on the side of the second main surface 16b are disposed to overlap each other in plan view from the Y' direction.

The first inclined surface 17 is an inclined surface that is inclined at a predetermined inclination angle with respect to the first main surface 16a. In the present embodiment, the first inclined surface 17 is inclined so that a thickness of the second vibrating portion 5 becomes thinner as approaching the second inclined surface 18 of the third vibrating portion 7.

As shown in FIG. 3, the third vibrating portion 7 has a second inclined surface 18 and the second main surface 16b of the quartz crystal substrate 2. A pair of third excitation electrodes 8 are formed on the second inclined surface 18 and the second main surface 16b of the third vibrating portion 7 so as to sandwich the third vibrating portion 7 in the thickness direction of the quartz crystal substrate 2. The third excitation electrode 8 on a side of the second inclined surface 18 and the third excitation electrode 8 on the side of the second main surface 16b are disposed to overlap each other in plan view from the Y' direction.

The second inclined surface 18 is an inclined surface that is inclined at a predetermined inclination angle with respect to the first main surface 16a. In the present embodiment, the second inclined surface 18 is inclined so that a thickness of the third vibrating portion 7 becomes thinner as approaching the first inclined surface 17 of the second vibrating portion 5.

The first main surface 16a and the second main surface 16b of the fixing portion 9 are formed with the terminal 10 electrically coupled to the first excitation electrode 4 formed in the first vibrating portion 3 via the lead electrode 13, the terminal 11 electrically coupled to the second excitation electrode 6 formed in the second vibrating portion 5 via the lead electrode 14, and the terminal 12 electrically coupled to the third excitation electrode 8 formed in third vibrating portion 7 via the lead electrode 15, respectively.

Further, the first main surface 16a and the second main surface 16b of the fixing portion 9 are formed with the terminals 10, 11, and 12 which are not coupled to the lead electrodes 13, 14, and 15, respectively, and are electrically coupled to the terminals 10, 11, and 12 which are coupled to the lead electrodes 13, 14, and 15 via side surface electrodes (not shown).

Since the first vibrating element X1 is formed with a pair of first excitation electrodes 4 on both the main surfaces 16a and 16b of the first vibrating portion 3, it is possible to vibrate the first vibrating portion 3 by applying a voltage to the terminal 10.

Since the second vibrating element X2 is formed with a pair of second excitation electrodes 6 on the first inclined surface 17 and the second main surface 16b of the second vibrating portion 5 so as to sandwich the second vibrating portion 5 in the thickness direction of the quartz crystal substrate 2, it is possible to vibrate the second vibrating portion 5 by applying the voltage to the terminal 11.

Since the third vibrating element X3 is formed with a pair of third excitation electrodes 8 on the second inclined surface 18 and the second main surface 16b of the third vibrating portion 7 so as to sandwich the third vibrating portion 7 in the thickness direction of the quartz crystal substrate 2, it is possible to vibrate the third vibrating portion 7 by applying the voltage to the terminal 12.

A through hole 19 is provided between the second vibrating portion 5 and the third vibrating portion 7. When the through hole 19 is provided, it is possible to reduce transmission of vibration of the second vibrating portion 5 to the third vibrating portion 7, and, conversely, it is possible to reduce transmission of the vibration of the third vibrating portion 7 to the second vibrating portion 5.

A plurality of through holes 19 may be provided or may not be provided.

Next, a cutting angle of the quartz crystal substrate 2 according to the present embodiment will be described with reference to FIG. 4.

Figure 4:
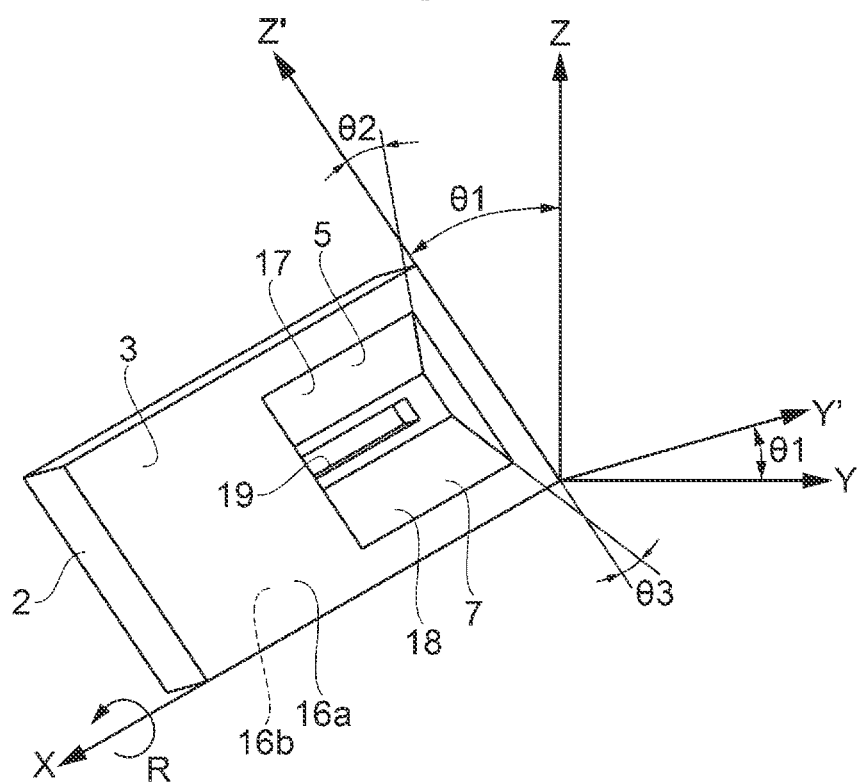
FIG. 4 is a diagram showing a cutting angle of a quartz crystal substrate.

An axis in FIG. 4 and an arrow side of an arrow R are referred to as a "positive direction", and a side opposite to the arrow is referred to as a "negative direction".

As shown in FIG. 4, a piezoelectric material, such as quartz crystal, belongs to a trigonal system and has an X axis, a Y axis, and a Z axis which are crystal axes orthogonal to each other. The X axis, the Y axis, and the Z axis are referred to as an electric axis, a mechanical axis, and an optical axis, respectively.

For example, as a piezoelectric substrate, a flat plate made of a so-called rotating Y-cut quartz crystal substrate, which is cut out from quartz crystal, along a plane obtained by rotating an XZ surface around the X axis by a predetermined angle θ1 is used as the quartz crystal substrate 2. An angle θ1 is also referred to as a cutting angle of the rotating Y-cut quartz crystal substrate.

A rotation direction for rotating the XZ surface around the X axis is indicated by the arrow R, and counterclockwise rotation is referred to as a positive rotation and clockwise rotation is referred to as a negative rotation when viewed from the positive direction of the X axis which is a rotation axis.

Assuming that a coordinate axis obtained by rotating the Y axis by the angle θ1 around the X axis is the Y' axis and a coordinate axis obtained by rotating the Z axis by the angle θ1 around the X axis is the Z' axis, it is possible to represent the rotating Y-cut quartz crystal substrate by the X axis, the Y' axis, and the Z' axis which are crystal axes orthogonal to each other. In the rotating Y-cut quartz crystal substrate, the thickness direction is the Y' direction, the XZ' surface including the X axis and the Z' axis orthogonal to the Y' axis is the main surface, and thickness slip vibration is excited as main vibration on the main surface.

Here, the rotating Y-cut quartz crystal substrate having the angle θ1 of approximately 35°15' is called an AT cut quartz crystal substrate and has an excellent frequency-temperature characteristic. Hereinafter, in the present embodiment, an example of the quartz crystal substrate 2 will be described using the AT cut quartz crystal substrate. However, the present disclosure is not limited to the AT cut quartz crystal substrate and may be, for example, a quartz crystal substrate, such as a BT-cut, that excites the thickness slip vibration. When the AT cut quartz crystal substrate is used as the quartz crystal substrate 2, the angle θ1 may be approximately 35°15', and, for example, the angle θ1 may be 35°17'.

In the present embodiment, the angle θ1 of the quartz crystal substrate 2 is set to 35°15'. Therefore, the cutting angle of both the main surfaces 16a and 16b of the quartz crystal substrate 2 is the angle θ1, that is, 35°15'.

The first inclined surface 17 of the quartz crystal substrate 2 is inclined by an angle θ2 based on the first main surface 16a. That is, since the first inclined surface 17 of the quartz crystal substrate 2 rotates in the negative direction around the X axis from the Z' axis, the cutting angle of the first inclined surface 17 is θ1−θ2, that is, 35°15'−θ2.

The second inclined surface 18 of the quartz crystal substrate 2 is inclined by an angle θ3 based on the first main surface 16a. That is, since the second inclined surface 18 of the quartz crystal substrate 2 rotates in the positive direction around the X axis from the Z' axis, the cutting angle of the second inclined surface 18 is θ1+θ3, that is, 35°15'+θ3.

In the present embodiment, the cutting angle of the first inclined surface 17 is θ1−θ2, the cutting angle of the second inclined surface 18 is θ1+θ3. The cutting angle of both the main surfaces 16a and 16b, the cutting angle of the first inclined surface 17 and the cutting angle of the second inclined surface 18 are different from each other.

The fact that the cutting angle of the first inclined surface 17 and the cutting angle of the second inclined surface 18 are different from each other indicates that the second inclined surface 18 is inclined with respect to the first inclined surface 17.

Next, a relationship between the cutting angle of the quartz crystal substrate 2 and the frequency-temperature characteristic will be described with reference to FIGS. 5 and 6.

Figure 5:
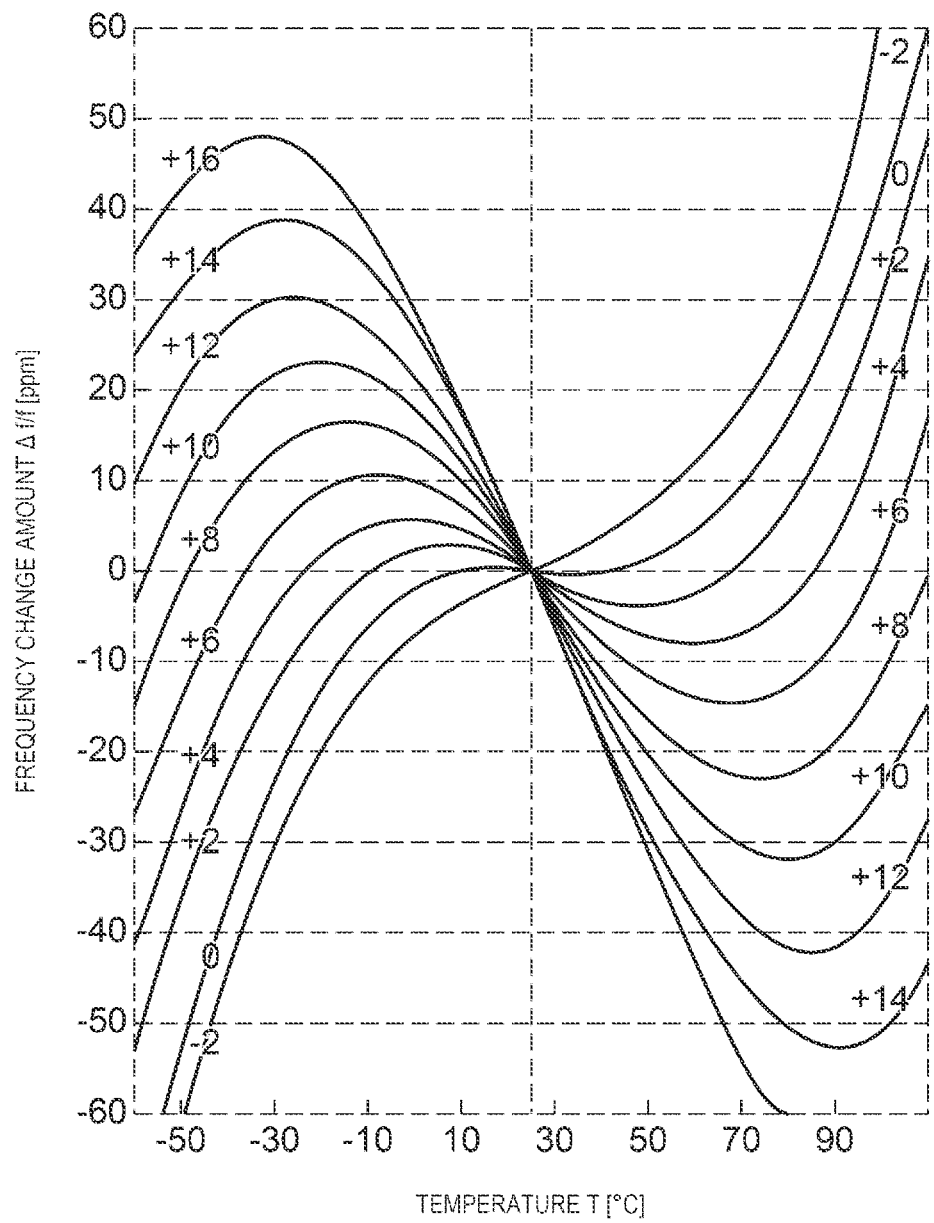
FIG. 5 is a graph showing a relationship between the cutting angle of the quartz crystal substrate and a frequency-temperature characteristic.

In addition, FIG. 5 shows the relationship of frequency-temperature characteristic with respect to the cutting angle when the cutting angle is changed at intervals of 2' based on the AT cut quartz crystal substrate having a cutting angle of 35°15' in the rotating Y-cut quartz crystal substrate. For example, in FIG. 5, a curve indicated by +10 shows the frequency-temperature characteristic of the rotating Y-cut quartz crystal substrate having a cutting angle of 35°15'+10', that is, a cutting angle of 35°25'. When the cutting angle is changed as above, it is possible to adjust a frequency change amount $\Delta f/f$ with respect to temperature change.

Here, in the present embodiment, one of the pair of second excitation electrodes 6 for exciting the second vibrating portion 5 is provided on the first inclined surface 17, and the other is provided on the second main surface 16b. Therefore, the frequency-temperature characteristic of the second vibrating element X2 according to the present embodiment becomes an intermediate characteristic between the frequency-temperature characteristic corresponding to the cutting angle $\theta 1-\theta 2=35°15'-\theta 2$ of the first inclined surface 17 and the frequency-temperature characteristic corresponding to the cutting angle $\theta 1=35°15'$ of the second main surface 16b. Specifically, the frequency change amount $\Delta f/f$ with respect to temperature change of the second vibrating element X2 becomes the frequency change amount $\Delta f/f$ with respect to the temperature change when the cutting angle is $((\theta 1-\theta 2)+\theta 1)/2=(2\theta 1-\theta 2)/2$, that is, $\theta 1-\theta 2/2=35°15'-\theta 2/2$.

Further, one of the pair of third excitation electrodes 8 for exciting the third vibrating portion 7 is provided on the second inclined surface 18 and the other is provided on the second main surface 16b. Therefore, the frequency-temperature characteristic of the third vibrating element X3 according to the present embodiment becomes an intermediate characteristic between the frequency-temperature characteristic corresponding to the cutting angle $35°15'+\theta 3$ of the second inclined surface 18 and the frequency-temperature characteristic corresponding to the cutting angle $35°15'$ of the second main surface 16b. Specifically, the frequency change amount $\Delta f/f$ with respect to temperature change of the third vibrating element X3 becomes the frequency change amount $\Delta f/f$ with respect to the temperature change when the cutting angle is $35°15'+\theta 3/2$.

Figure 6:
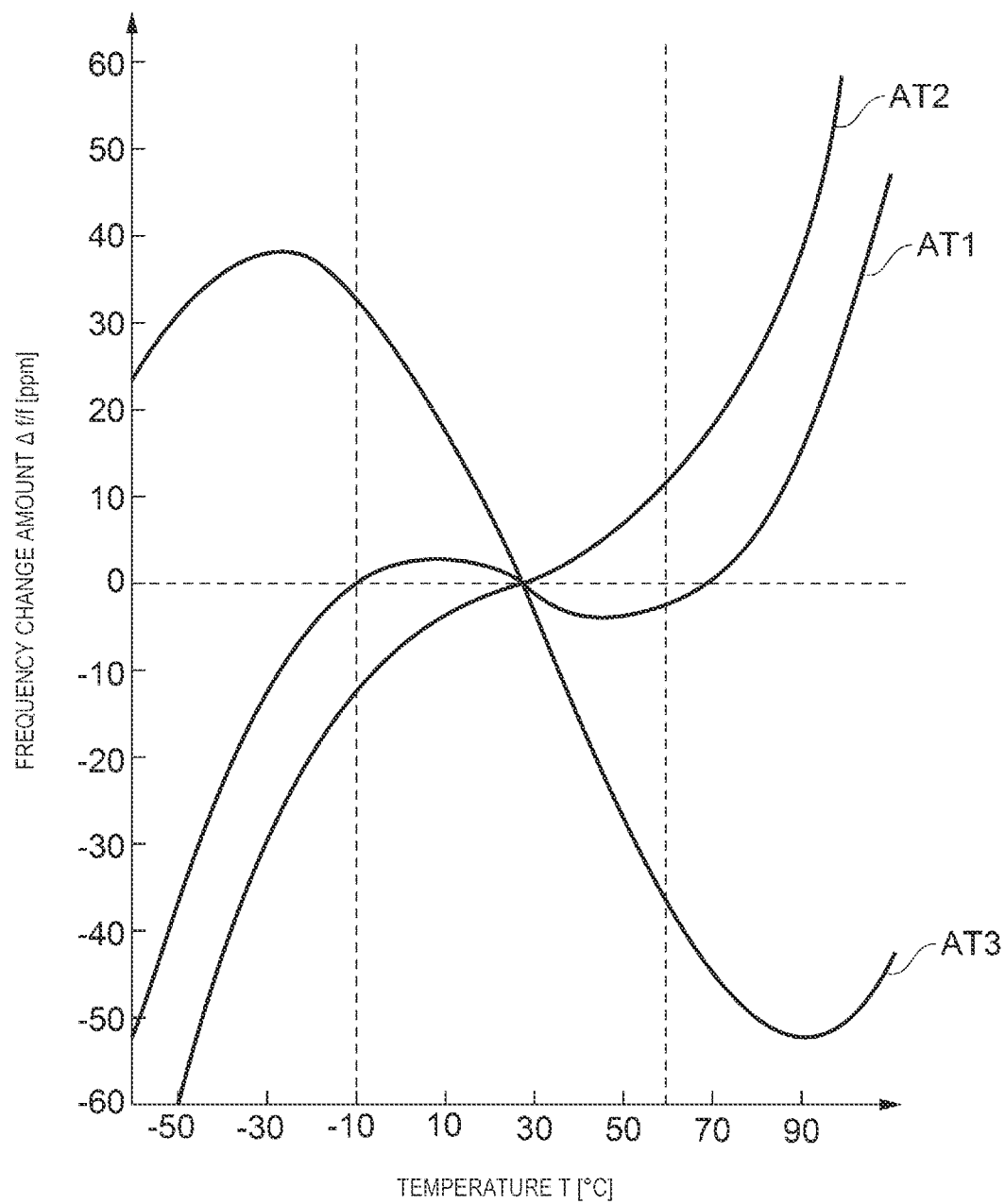
FIG. 6 is a graph showing an example of a frequency-temperature characteristic of the vibrating element.

In FIG. 6 showing an example of a frequency-temperature characteristic of the vibrating element 1 according to the present embodiment, AT1 indicates the frequency-temperature characteristic of the first vibrating element X1, AT2 indicates the frequency-temperature characteristic of the second vibrating element X2, and AT3 indicates the frequency-temperature characteristic of the third vibrating element X3. As shown in FIG. 6, the frequency-temperature characteristics are different from each other in the first vibrating portion 3 of the first vibrating element X1, the second vibrating portion 5 of the second vibrating element X2, and the third vibrating portion 7 of the third vibrating element X3.

Since the angle $\theta 1$ of the first vibrating portion 3 is 35°15' and the AT cut quartz crystal substrate is used as it is, the frequency change amount $\Delta f/f$ of the first vibrating element X1 with respect to the temperature change is small. Therefore, when the first vibrating element X1 is used for oscillation signal output, it is possible to obtain an oscillation signal that is relatively stable with respect to the temperature change.

When the second vibrating portion 5 changes the angle $\theta 2$ of the first inclined surface 17 or the third vibrating portion 7 changes the angle $\theta 3$ of the second inclined surface 18, it is possible to adjust the frequency change amount $\Delta f/f$ with respect to the temperature change to be larger than the frequency change amount $\Delta f/f$ of the first vibrating portion 3. When the frequency change amount $\Delta f/f$ of the second vibrating element X2 and the third vibrating element X3 with respect to the temperature change is large, the resolution of the temperature change with respect to the frequency change is high and the temperature can be detected with high accuracy. Therefore, when the second vibrating element X2 and the third vibrating element X3 are used for temperature detection, the temperature can be detected with high accuracy.

In the present embodiment, the cutting angle of the first inclined surface 17 of the second vibrating portion 5 is $\theta 1-\theta 2$, that is, $35°15'-\theta 2$, when the cutting angle of both the main surfaces 16a and 16b is set to $\theta 1$. The cutting angle of the first inclined surface 17 of the second vibrating portion 5 is smaller than the cutting angle $\theta 1$ of both the main surfaces 16a and 16b. Further, the cutting angle of the second inclined surface 18 of the third vibrating portion 7 is $\theta 1+\theta 3$, that is, $35°15'+\theta 3$, which is larger than the cutting angle $\theta 1$ of both the main surfaces 16a and 16b. When the cutting angle of the first inclined surface 17 of the second vibrating portion 5 and the cutting angle of the second inclined surface 18 of the third vibrating portion 7 are set to angles different from each other, respectively, the respective frequency-temperature characteristics of the second vibrating element X2 and the third vibrating element X3 for temperature detection can be made different from each other.

When the frequency-temperature characteristics of the second vibrating element X2 and the third vibrating element X3 for temperature detection are made different from each other, respectively, the temperature detection is performed based on the second vibrating element X2, for example, in a temperature range where the resolution of the temperature change with respect to the frequency change is higher in the second vibrating element X2 than in the third vibrating element X3 and the temperature detection can be performed with high accuracy, and in a temperature range where the resolution of the temperature change with respect to the frequency change is higher in the third vibrating element X3 than in the second vibrating element X2 and the temperature detection can be performed with high accuracy, when the temperature detection is performed based on the third vibrating element X3, it is possible to perform the temperature detection with even higher accuracy.

For example, in FIG. 6, in a temperature range where a temperature T is −10° C. to 60° C., the third vibrating element X3 has a higher resolution of the temperature change with respect to the frequency change than the second vibrating element X2, so that the temperature detection may be performed based on the third vibrating element X3. On the other hand, in a temperature range where the temperature T is lower than −10° C. or higher than 60° C., the third vibrating element X3 has a low resolution of the temperature change with respect to the frequency change, and, further, the frequency change of the third vibrating element X3 does not show a monotonous increase or monotonous decrease with respect to the temperature change. Therefore, in the temperature range where the temperature T is lower than −10° C. or higher than 60° C., the temperature detection may be performed based on the second vibrating element X2, which has the higher resolution of the temperature change with respect to the frequency change than the third vibrating element X3.

The temperature range where the second vibrating element X2 is used for the temperature detection and the temperature range where the third vibrating element X3 is used for the temperature detection are not limited to the above-described temperature range, and the temperature range can be arbitrarily set based on the frequency-temperature characteristics of the second vibrating portion 5 and the third vibrating portion 7.

Further, since the first vibrating element X1, the second vibrating element X2, and the third vibrating element X3 are formed on the common quartz crystal substrate 2, heat transfer between the first vibrating element X1 and the second vibrating element X2, heat transfer between the first vibrating element X1 and the third vibrating element X3, and heat transfer between the second vibrating element X2 and the third vibrating element X3 are rapidly performed, respectively. Therefore, the temperature of the first vibrating element X1 can be detected quickly and accurately by the second vibrating element X2 and the third vibrating element X3 for temperature detection, so that temperature compensation of the first vibrating element X1 can be performed quickly and accurately. Further, the temperature difference between the second vibrating element X2 and the third vibrating element X3 can be reduced.

In the present embodiment, the first inclined surface 17 is formed on the first main surface 16a of the quartz crystal substrate 2, but it may be formed on the second main surface 16b or may be formed on both sides of both the main surfaces 16a and 16b.

Further, in the present embodiment, the second inclined surface 18 is formed on the first main surface 16a of the quartz crystal substrate 2, but it may be formed on the second main surface 16b or may be formed on both sides of both the main surfaces 16a and 16b.

When the AT cut quartz crystal substrate is used as the quartz crystal substrate 2, the cutting angle of the inclined surface on a side, which has the larger cutting angle, of the first inclined surface 17 of the quartz crystal substrate 2 and the second inclined surface 18 of the quartz crystal substrate 2 is set to θa, and the cutting angle of the inclined surface of the other side is set to θb, a preferable range of the cutting angle θb is equal to or larger than θa−1° and is equal to or less than θa−20°. When the cutting angle θb is set to be equal to or larger than θa−1°, the difference between the cutting angle of the first inclined surface 17 of the quartz crystal substrate 2 and the cutting angle of the second inclined surface 18 of the quartz crystal substrate 2 becomes sufficiently large, so that the frequency-temperature characteristics of the second vibrating element X2 and the third vibrating element X3 for temperature detection can be sufficiently different from each other and the temperature detection can be performed with high accuracy, thereby being preferable. Further, when the cutting angle θb is increased, it is difficult to form the inclined surface, so that it is preferable to set the cutting angle θb to be equal to or less than θa−20°. In the present embodiment, the cutting angle θ1−θ2 of the first inclined surface 17 corresponds to θb, and the cutting angle θ1+θ3 of the second inclined surface 18 corresponds to θa.

As described above, in the vibrating element 1 according to the present embodiment, the frequency change amounts with respect to the temperature change of the second vibrating element X2 having the first inclined surface 17 and the third vibrating element X3 having the second inclined surface 18 can be larger than the frequency change amount with respect to the temperature change of the first vibrating element X1, so that, when the second vibrating element X2 and the third vibrating element X3 are used for temperature detection, the resolution of the temperature change with respect to the frequency change is high, the temperature detection can be performed with high accuracy, and the temperature of the first vibrating element X1 can be detected with high accuracy.

1.2. Method for Manufacturing Vibrating Element

Next, a method for manufacturing the vibrating element 1 will be described with reference to FIGS. 7 to 12.

The method for manufacturing the vibrating element 1 includes a quartz crystal substrate preparation step, a resist applying step, a dry etching step, an individualization step, and an electrode forming step.

1.2.1. Quartz Crystal Substrate Preparation Step

Figure 7:
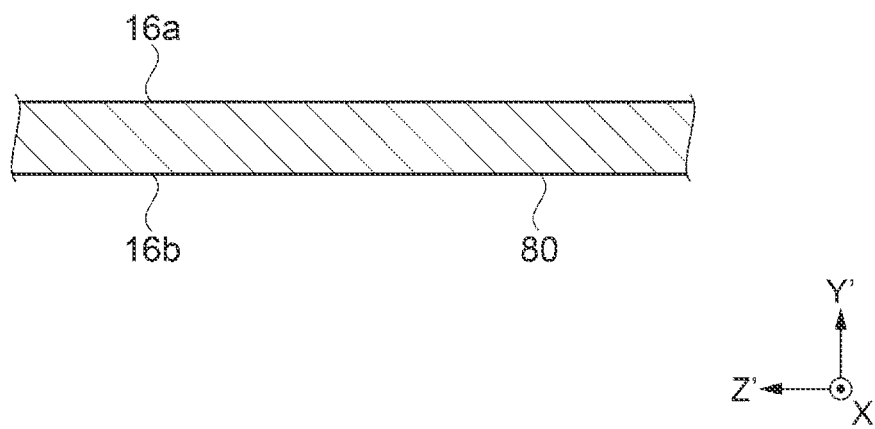
FIG. 7 is a schematic cross-sectional diagram showing a manufacturing step of the vibrating element.

As shown in FIG. 7, in consideration of mass productivity and manufacturing cost of the vibrating element 1, a large quartz crystal substrate 80 capable of manufacturing a plurality of vibrating elements 1 by a batch processing method is prepared. The large quartz crystal substrate 80 has a desired thickness by cutting a rough quartz crystal at a predetermined cutting angle θ1 and by performing wrapping, polishing, or the like. In the present embodiment, the cutting angle θ1 is 35°15'.

1.2.2. Resist Applying Step

Figure 8:
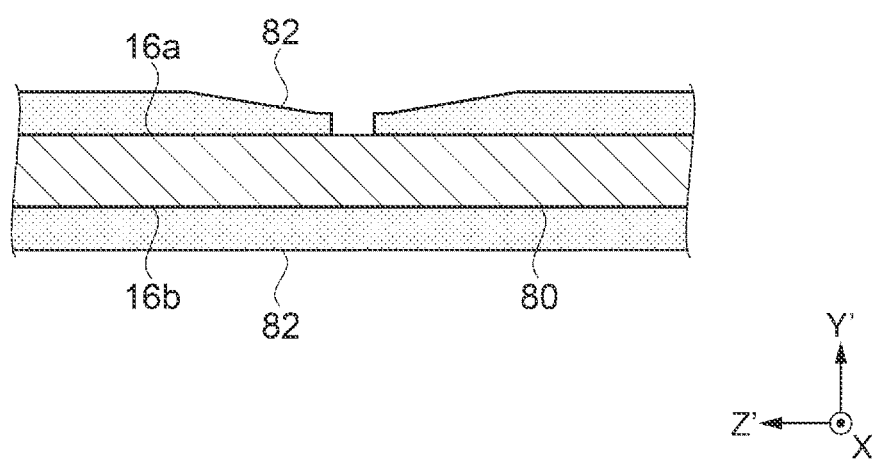
FIG. 8 is a schematic cross-sectional diagram showing the manufacturing step of the vibrating element.

As shown in FIG. 8, a resist 82 is applied to both the main surfaces 16a and 16b of the large quartz crystal substrate 80. Here, as a method for applying the resist 82 to the first main surface 16a, a method is used which includes filling a mold having a depression corresponding to a shape of the first inclined surface 17 on which the second excitation electrode 6 is formed and the second inclined surface 18 on which the third excitation electrode 8 is formed, and transferring the resist 82 filled in the mold to the first main surface 16a and curing the resist 82. The resist 82 is not applied to a part for forming the through hole 19.

1.2.3. Dry Etching Step

Figure 9:
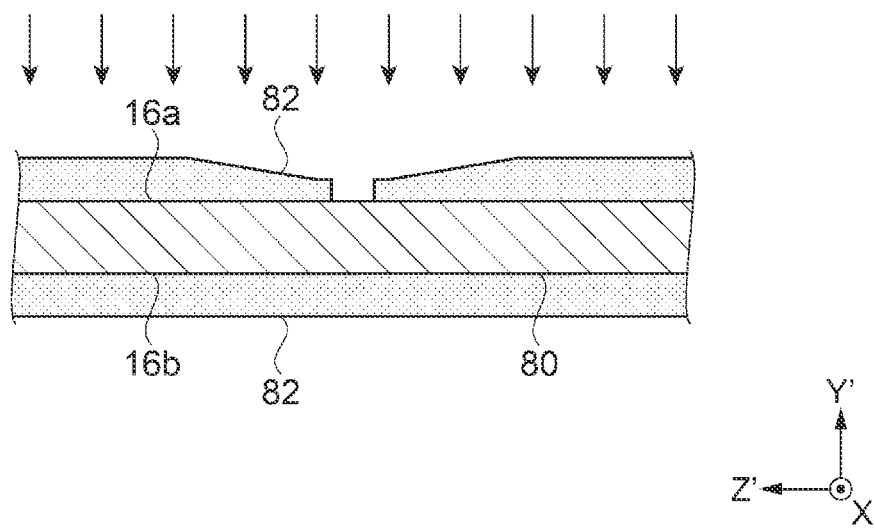
FIG. 9 is a schematic cross-sectional diagram showing the manufacturing step of the vibrating element.

Next, with a dry etching method, dry etching is performed from above the first main surface 16a using a plasma etching device or the like, as shown by an arrow in FIG. 9.

Figure 10:
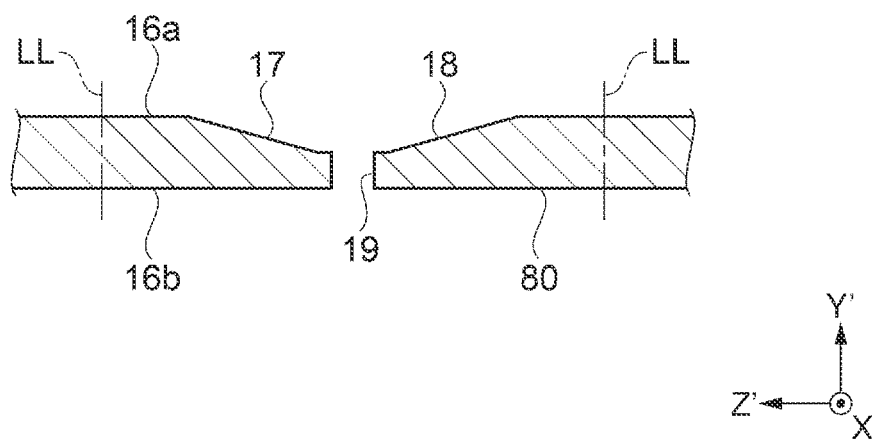
FIG. 10 is a schematic cross-sectional diagram showing the manufacturing step of the vibrating element.

FIG. 10 represents a state in which the resist 82 is removed by dry etching. A shape of the resist 82 having a shape of an inclined surface on the first main surface 16a formed in FIG. 8 is directly transferred to the large quartz crystal substrate 80 to be thinned. In this way, the first inclined surface 17 and the second inclined surface 18 are formed on the large quartz crystal substrate 80.

1.2.4. Individualization Step

Figure 11:
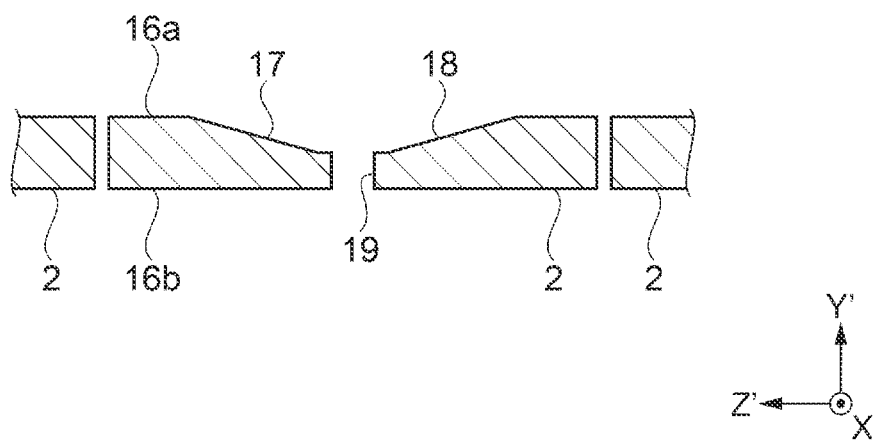
FIG. 11 is a schematic cross-sectional diagram showing the manufacturing step of the vibrating element.

In FIG. 10, since a plurality of quartz crystal pieces are coupled to the large quartz crystal substrate 80, the large quartz crystal substrate 80 is made individualized. The large quartz crystal substrate 80 is individualized by a dicing method or a wet etching method based on virtual line LL of FIG. 10. FIG. 11 shows the individualized quartz crystal substrate 2.

1.2.5. Electrode Forming Step

Figure 12:
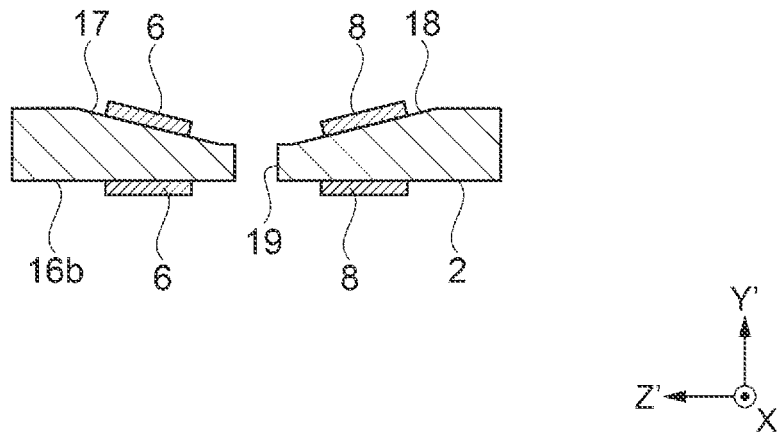
FIG. 12 is a schematic cross-sectional diagram showing the manufacturing step of the vibrating element.

As shown in FIG. 12, the first excitation electrodes 4, the second excitation electrodes 6, the third excitation electrodes 8, and the like are formed on the individualized quartz crystal substrate 2 by vapor deposition or sputtering to form the vibrating element 1.

The first inclined surface 17 and the second inclined surface 18 may be formed by a method other than the above-described methods. For example, as a method for forming the partially thinned resist 82, a method using grayscale exposure in which the resist 82 is exposed under conditions having different light amount distributions may be used.

Further, a method for, before individualizing the large quartz crystal substrate 80, collectively forming the first excitation electrodes 4, the second excitation electrodes 6, the third excitation electrodes 8 and the like on the large quartz crystal substrate 80 and then individualizing the large quartz crystal substrate 80 to obtain the vibrating element 1 may be used.

Further, the first vibrating element X1, the second vibrating element X2, and the third vibrating element X3 are formed on the common quartz crystal substrate 2, and heat transfer is performed rapidly between the first vibrating element X1, the second vibrating element X2, and the third vibrating element X3. Further, since the first inclined surface 17 and the second inclined surface 18 can be formed using a method for manufacturing the vibrating element, such as a dry etching method, in which the load on the quartz crystal substrate 2 is small, decrease in the mechanical strength of the quartz crystal substrate 2 or deterioration over time is unlikely to occur.

2. Second Embodiment

A schematic configuration of a vibrating element 1*a* according to a second embodiment will be described with reference to FIGS. 13 and 14. The same components as in the first embodiment are designated by the same reference symbols, and duplicate description will be omitted.

Figure 13:
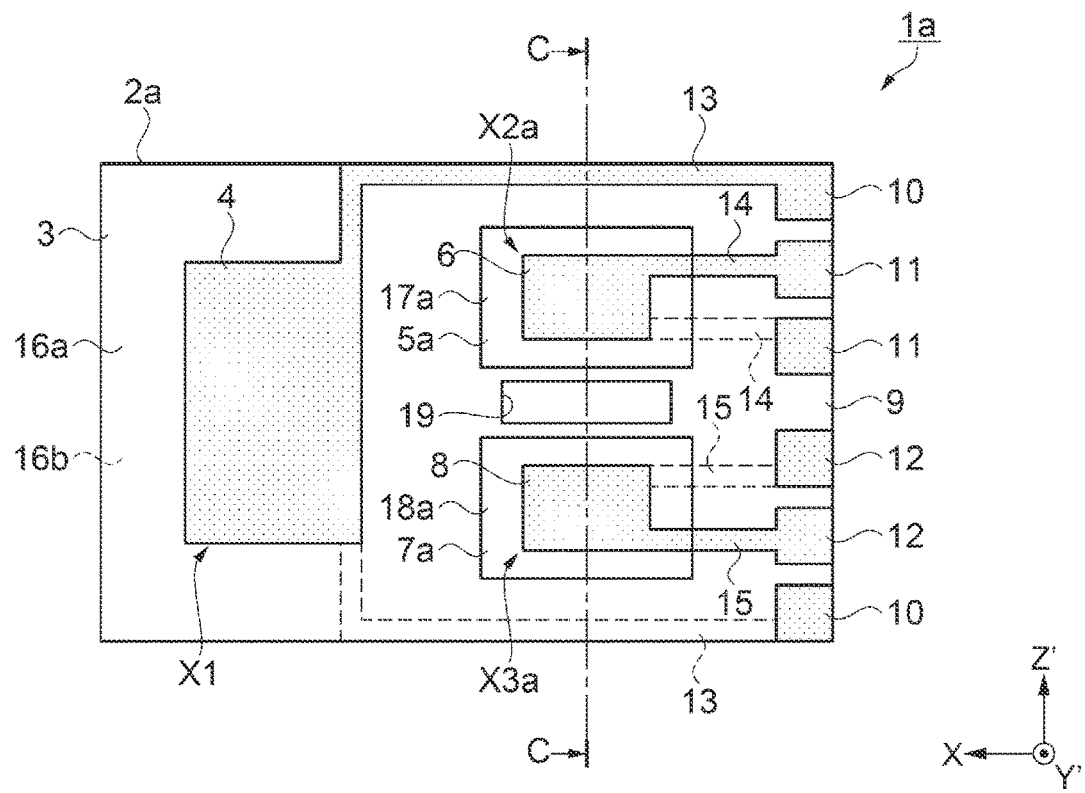
FIG. 13 is a plan diagram showing a vibrating element according to a second embodiment.
Figure 14:
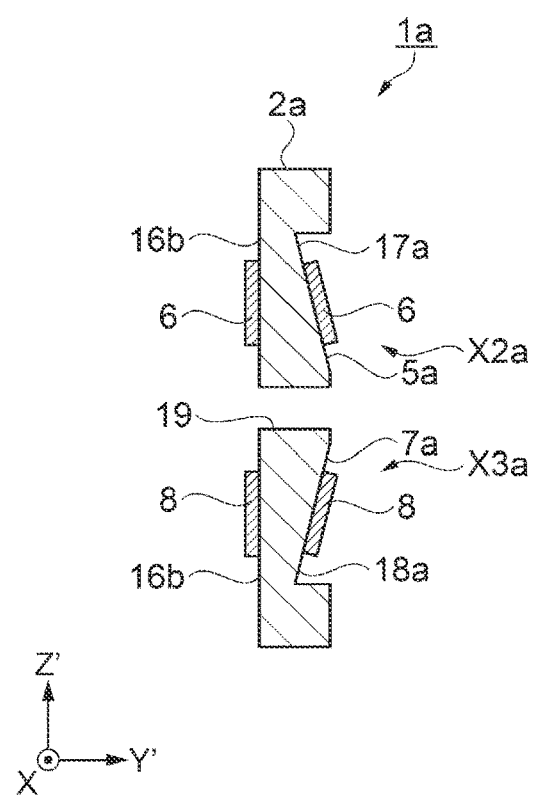
FIG. 14 is a cross-sectional diagram taken along a line C-C in FIG. 13.

As shown in FIGS. 13 and 14, in a quartz crystal substrate 2*a* according to the present embodiment, a first inclined surface 17*a* provided on the second vibrating portion 5*a* and a second inclined surface 18*a* provided on the third vibrating portion 7*a* are inclined so that a thickness of a second vibrating portion 5*a* and a thickness of a third vibrating portion 7*a* become thinner as being separated from each other.

The first inclined surface 17*a* of the quartz crystal substrate 2*a* is rotated in a positive direction by an angle $\theta 2$ from a Z' axis to an X axis. That is, when cutting angle of both main surfaces 16*a* and 16*b* is set to $\theta 1$, a cutting angle of the first inclined surface 17*a* is $\theta 1+\theta 2$, that is, $35°15'+\theta 2$ which is larger than the cutting angle $\theta 1$ of both the main surfaces 16*a* and 16*b*. Further, the second inclined surface 18*a* of the quartz crystal substrate 2*a* is rotated in a negative direction by an angle $\theta 3$ around the X axis from the Z' axis. That is, a cutting angle of the second inclined surface 18*a* is $\theta 1-\theta 3$, that is, $35°15'-\theta 3$ which is smaller than the cutting angle $\theta 1$ of both the main surfaces 16*a* and 16*b*. As described above, the cutting angle of the first inclined surface 17*a* is $\theta 1+\theta 2$, the cutting angle of the second inclined surface 18*a* is $\theta 1-\theta 3$, and the cutting angle of the first inclined surface 17*a* and the cutting angle of the second inclined surface 18*a* are different from each other.

According to the present embodiment, the frequency change amount of the frequency-temperature characteristics of the second vibrating element X2*a* having the second vibrating portion 5*a* and a third vibrating element X3*a* having the third vibrating portion 7*a* can be larger than that of the frequency-temperature characteristic of the first vibrating portion 3, so that, when the second vibrating element X2*a* and the third vibrating element X3*a* are used for temperature detection, the resolution of the temperature change with respect to the frequency change is high, accurate temperature detection can be performed, and the same effect as in the first embodiment can be obtained.

3. Third Embodiment

A schematic configuration of a vibrating element 1*b* according to a third embodiment will be described with reference to FIGS. 15 and 16. The same components as in the first embodiment are designated by the same reference symbols, and duplicate description will be omitted.

Figure 15:
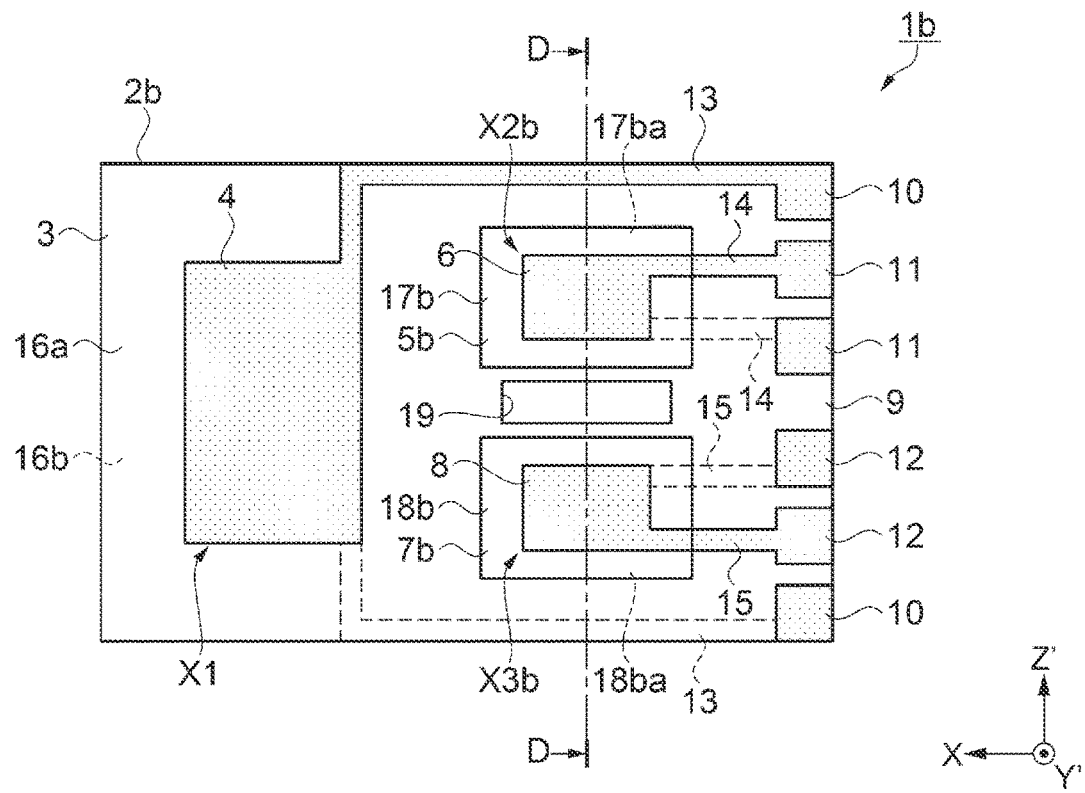
FIG. 15 is a plan diagram showing a vibrating element according to a third embodiment.
Figure 16:
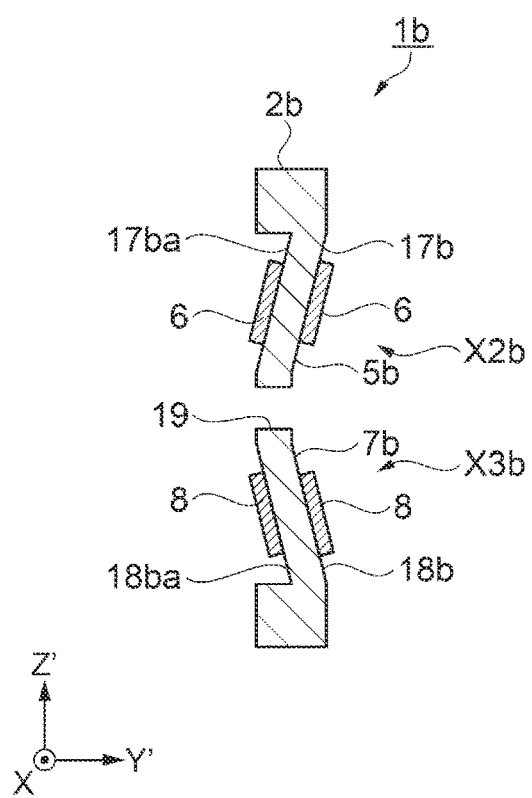
FIG. 16 is a cross-sectional diagram taken along a line D-D in FIG. 15.

As shown in FIGS. 15 and 16, a quartz crystal substrate 2*b* according to the present embodiment includes a surface 17*ba* parallel to a first inclined surface 17*b* on a back side of the first inclined surface 17*b* in a second vibrating portion 5*b*, and a surface 18*ba* parallel to a second inclined surface 18*b* on a back side of the second inclined surface 18*b* in a third vibrating portion 7*b*.

The second vibrating portion 5*b* of the quartz crystal substrate 2*b* is rotated in the negative direction by an angle $\theta 2$ around the X axis from the Z' axis. That is, when cutting angle of both the main surfaces 16*a* and 16*b* is $\theta 1=35°15'$, a cutting angle of the second vibrating portion 5*b* is $\theta 1-\theta 2$, that is, $35°15'-\theta 2$ which is smaller than the cutting angle $\theta 1$ of both the main surfaces 16*a* and 16*b*. Further, the third vibrating portion 7*b* of the quartz crystal substrate 2*b* is rotated in the positive direction by the angle $\theta 3$ around the X axis from the Z' axis. That is, a cutting angle of the third vibrating portion 7*b* is $\theta 1+\theta 3$, that is, $35°15'+\theta 3$, which is larger than the cutting angle $\theta 1$ of both the main surfaces 16*a* and 16*b*. As described above, the cutting angle of the second vibrating portion 5*b* is $\theta 1-\theta 2$, the cutting angle of the third vibrating portion 7*b* is $\theta 1+\theta 3$, and the cutting angle of the second vibrating portion 5*b* and the cutting angle of the third vibrating portion 7*b* are different from each other.

According to the present embodiment, the following effects can be obtained in addition to the effects of the first embodiment.

Since the second vibrating portion 5*b* and the third vibrating portion 7*b* are formed to have inclined surfaces whose front and back surfaces are parallel to each other, it is easy to confine vibration energy of the second vibrating portion 5*b* between the second excitation electrodes 6 and confine the vibration energy of the third vibrating portion 7*b* between the third excitation electrodes 8, as compared with a case where the inclined surfaces of the front and back surfaces are not parallel. Therefore, it is possible to obtain the second vibrating element X2*b* and the third vibrating element X3*b* having a small impedance and a high Q value.

4. Fourth Embodiment

A schematic configuration of a vibrating element 1*c* according to a fourth embodiment will be described with reference to FIGS. 17 and 18. The same components as in the first embodiment are designated by the same reference symbols, and duplicate description will be omitted.

Figure 17:
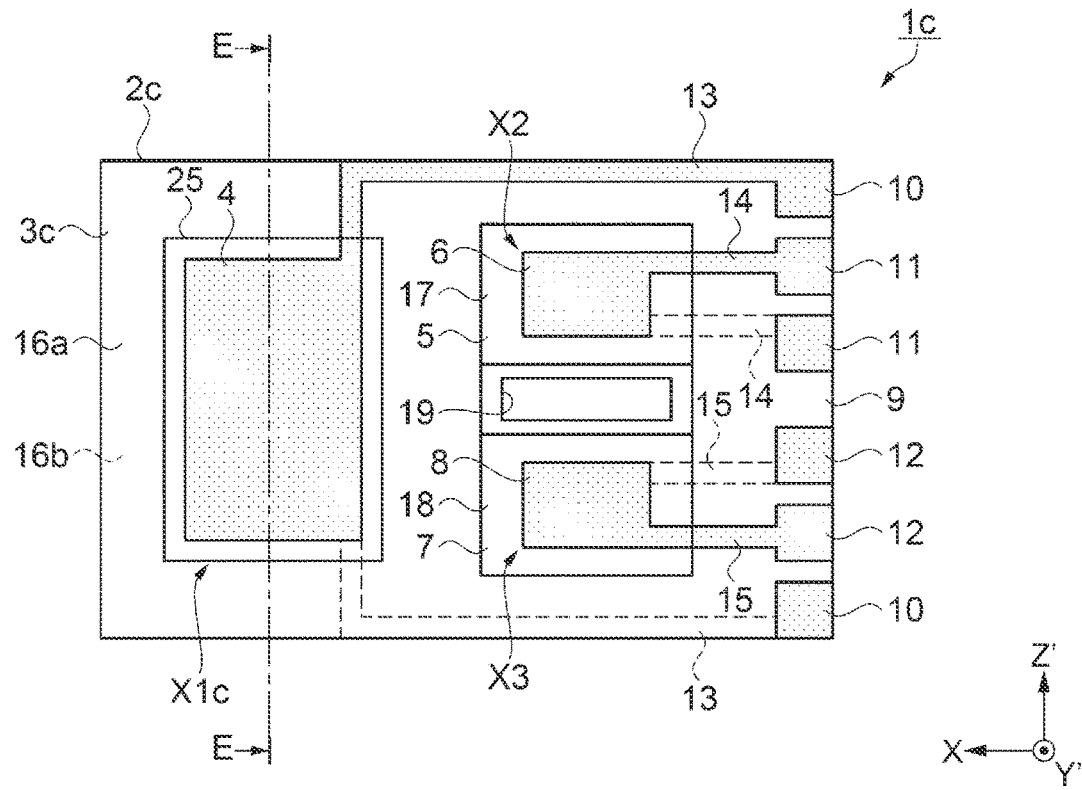
FIG. 17 is a plan diagram showing a vibrating element according to a fourth embodiment.
Figure 18:
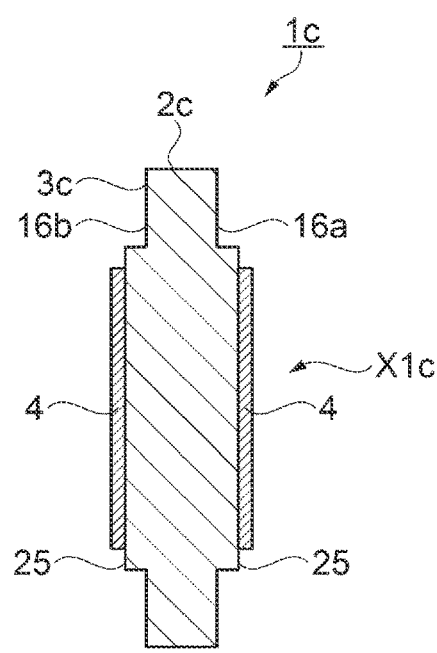
FIG. 18 is a cross-sectional diagram taken along a line E-E in FIG. 17.

As shown in FIGS. 17 and 18, a quartz crystal substrate 2*c* according to the present embodiment has projection portions 25 formed on both the main surfaces 16*a* and 16*b* of the first vibrating portion 3*c*, respectively. A pair of first excitation electrodes 4 are formed in the first vibrating portion 3*c* having the projection portions 25 so as to sandwich the first vibrating portion 3c in the thickness direction of the quartz crystal substrate 2c.

According to the present embodiment, the following effects can be obtained in addition to the effects of the first embodiment.

Since a first vibrating element X1c excites a region including the projection portions 25 of the first vibrating portion 3c by the first excitation electrodes 4, the vibration energy of the first vibrating portion 3c is confined into the region including the projection portions 25, and leakage of vibration to areas other than the region including the projection portions 25 can be reduced, so that the vibration of the first vibrating element X1c is stabilized. Further, since an impedance of the first vibrating element X1c can be lowered and the Q value is also increased, it is possible to realize a highly accurate oscillator having an excellent carrier-to-noise ratio when the first vibrating element X1c is used as an oscillator.

In the present embodiment, the projection portions 25 are formed on both sides of both the main surfaces 16a and 16b of the first vibrating portion 3c, respectively, but the projection portion 25 may be formed on any one of both the main surfaces 16a and 16b of the first vibrating portion 3c.

Further, in the present embodiment, the projection portions 25 have a mesa shape protruding in the Y' direction from both the main surfaces 16a and 16b of the first vibrating portion 3c, but the projection portions 25 may have a spherical shape.

5. Fifth Embodiment

A schematic configuration of the vibrating element 1d according to a fifth embodiment will be described with reference to FIGS. 19 and 20. The same components as in the first embodiment are designated by the same reference symbols, and duplicate description will be omitted.

Figure 19:
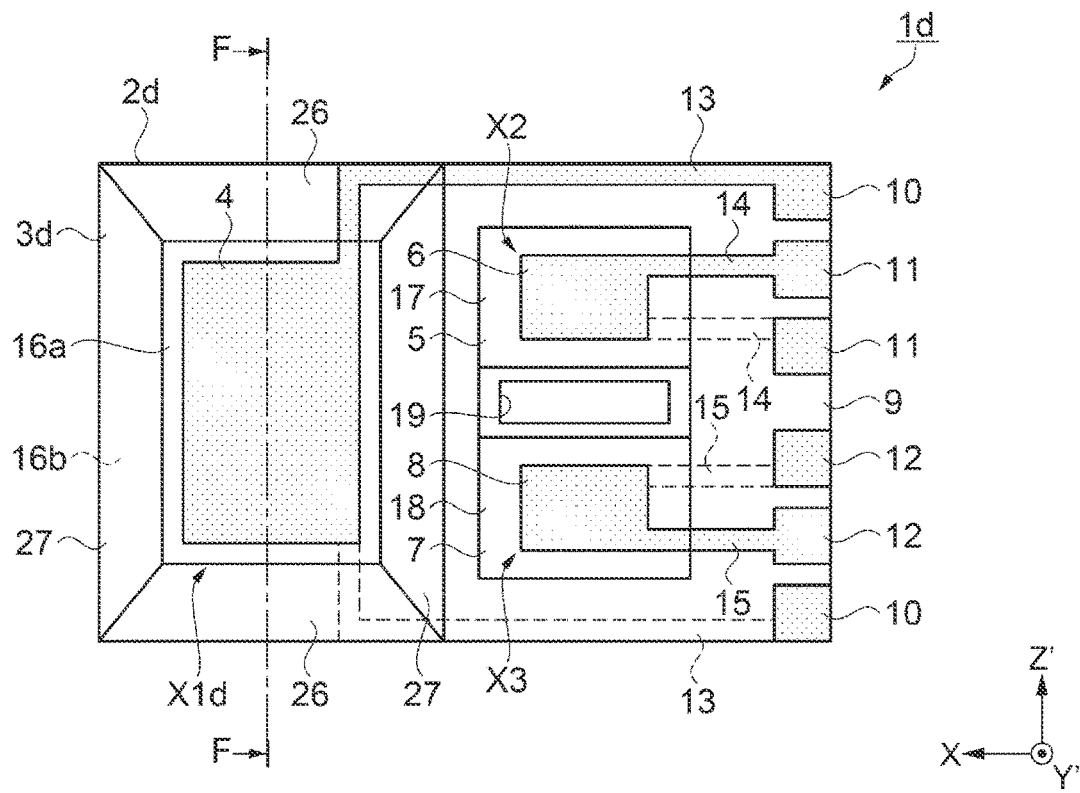
FIG. 19 is a plan diagram showing a vibrating element according to a fifth embodiment.
Figure 20:
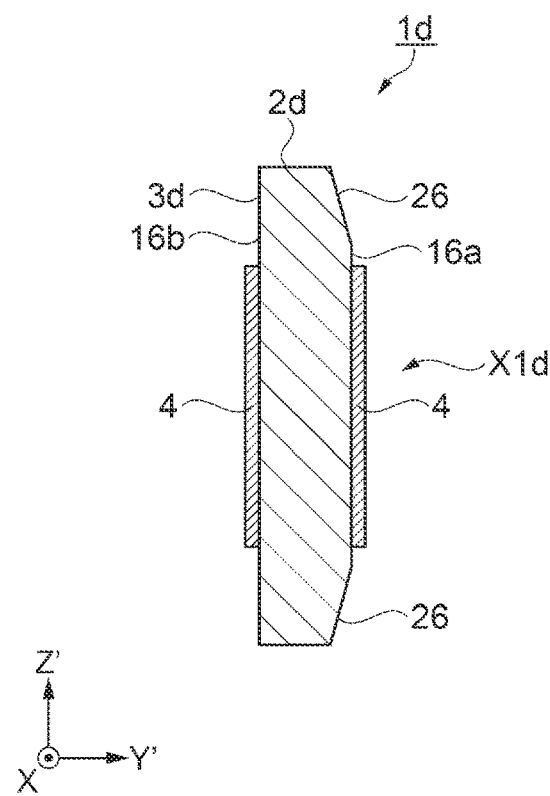
FIG. 20 is a cross-sectional diagram taken along a line F-F in FIG. 19.

As shown in FIGS. 19 and 20, a quartz crystal substrate 2d according to the present embodiment is formed with inclined portions 26 and 27, which are inclined so that the thickness of the quartz crystal substrate 2d becomes thinner toward an outer edge side of the quartz crystal substrate 2d from a side of a first excitation electrode 4, on a first main surface 16a of a first vibrating portion 3d.

According to the present embodiment, the following effects can be obtained in addition to the effects of the first embodiment.

In a first vibrating element X1d, the inclined portions 26 and 27, which are inclined so that the thickness of the quartz crystal substrate 2 becomes thinner toward the outer edge side of the quartz crystal substrate 2d, are formed around the first excitation electrode 4. Therefore, the vibration energy of the first vibrating portion 3d can be confined in the vicinity of the first excitation electrode 4 and the leakage of vibration to the inclined portions 26 and 27 can be reduced. Therefore, since an impedance of the first vibrating element X1d can be lowered and the Q value is also increased, a highly accurate oscillator having an excellent carrier-to-noise ratio can be realized when the first vibrating element X1d is used as an oscillator.

In the present embodiment, the inclined portions 26 and 27 are formed only on the first main surface 16a of the first vibrating portion 3d, but the inclined portions 26 and 27 may be formed on both the main surfaces 16a and 16b of the first vibrating portion 3d.

6. Sixth Embodiment

A schematic configuration of a vibrating element 1e according to a sixth embodiment will be described with reference to FIGS. 21 and 22. The same components as in the first embodiment are designated by the same reference symbols, and duplicate description will be omitted.

Figure 21:
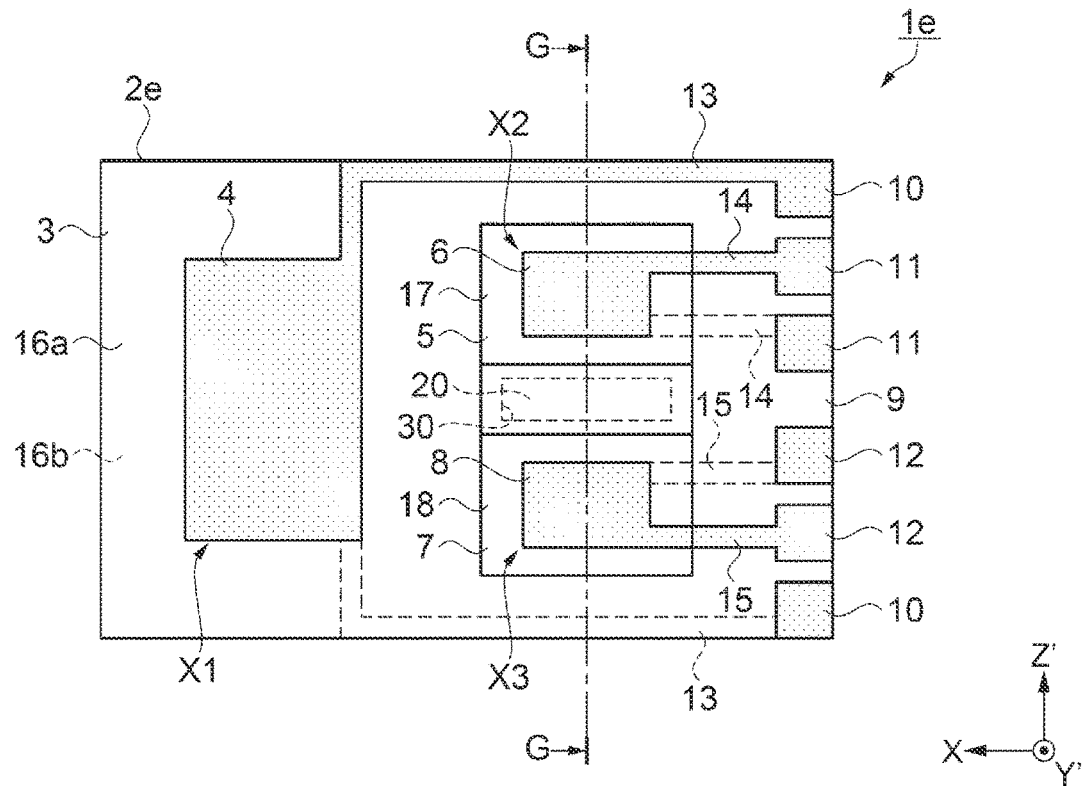
FIG. 21 is a plan diagram showing a vibrating element according to a sixth embodiment.
Figure 22:
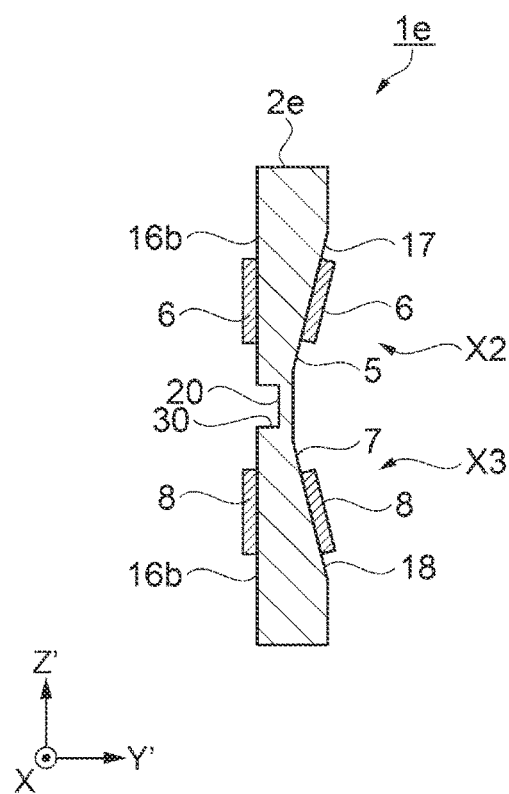
FIG. 22 is a cross-sectional diagram taken along a line G-G in FIG. 21.

As shown in FIGS. 21 and 22, a quartz crystal substrate 2e according to the present embodiment is provided with a recess portion 30, which opens on a side of a second main surface 16b, between the second vibrating portion 5 and the third vibrating portion 7. That is, as shown in FIG. 22, a thin wall portion 20 is formed between the second vibrating portion 5 and the third vibrating portion 7.

According to the present embodiment, the following effects can be obtained in addition to the effects of the first embodiment.

When the thin wall portion 20 is provided between the second vibrating portion 5 and the third vibrating portion 7, it is possible to suppress an interaction between the vibration of the second vibrating portion 5 and the vibration of the third vibrating portion 7.

The recess portion 30 may be formed on a side of a first main surface 16a.

7. Seventh Embodiment

A schematic configuration of a vibrating element 1f according to a seventh embodiment will be described with reference to FIGS. 23 and 24. The same components as in the first embodiment are designated by the same reference symbols, and duplicate description will be omitted.

Figure 23:
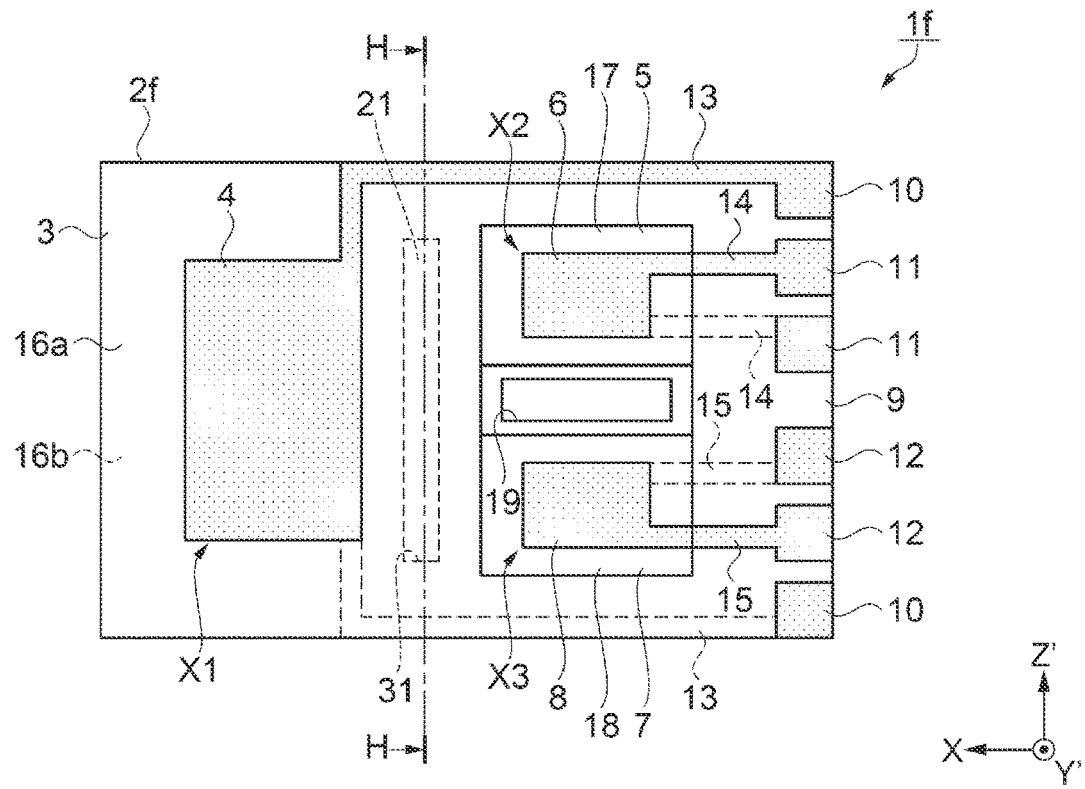
FIG. 23 is a plan diagram showing a vibrating element according to a seventh embodiment.
Figure 24:
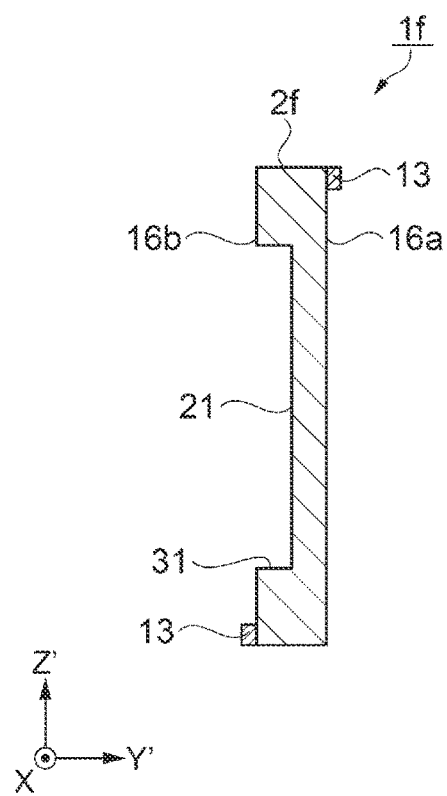
FIG. 24 is a cross-sectional diagram taken along a line H-H in FIG. 23.

As shown in FIGS. 23 and 24, a quartz crystal substrate 2f according to the present embodiment is provided with a recess portion 31, which opens on side of a second main surface 16b, between a first vibrating portion 3 and the second and third vibrating portions 5 and 7. That is, as shown in FIG. 24, a thin wall portion 21 is formed between the first vibrating portion 3 and the second and third vibrating portions 5 and 7.

According to the present embodiment, the following effects can be obtained in addition to the effects of the first embodiment.

When the thin wall portion 21 is provided between the first vibrating portion 3 and the second vibrating portion 5 and between the first vibrating portion 3 and the third vibrating portion 7, it is possible to suppress interaction between the vibration of the first vibrating portion 3, the vibration of the second vibrating portion 5, and the vibration of the third vibrating portion 7.

The recess portion 31 may be formed on a side of a first main surface 16a or may be used as a hole penetrating the quartz crystal substrate 2f.

8. Eighth Embodiment

A schematic configuration of a vibrating element 1g according to an eighth embodiment will be described with reference to FIGS. 25 and 26. The same components as in the first embodiment are designated by the same reference symbols, and duplicate description will be omitted.

Figure 25:
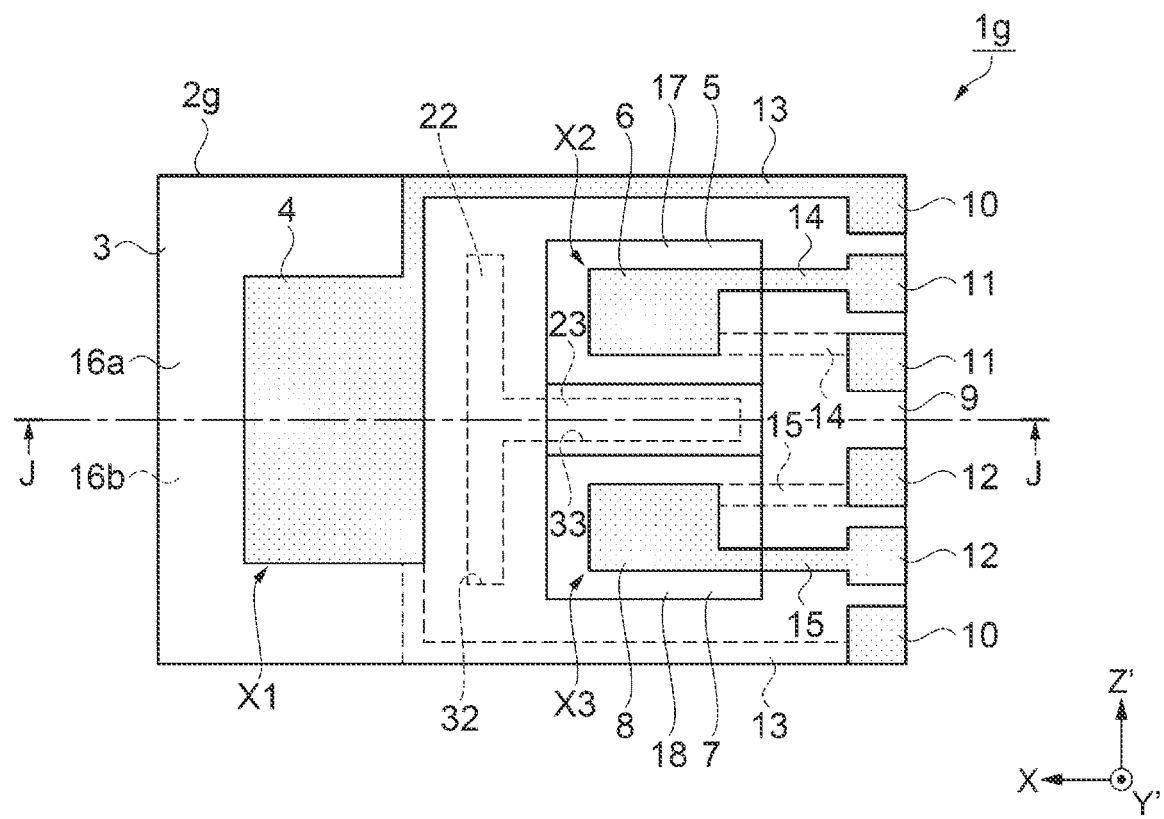
FIG. 25 is a plan diagram showing a vibrating element according to an eighth embodiment.
Figure 26:
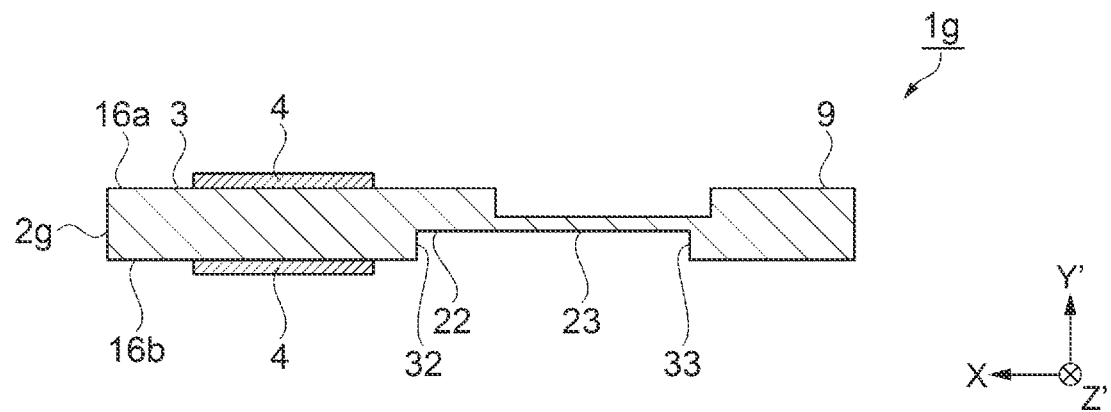
FIG. 26 is a cross-sectional diagram taken along a line J-J in FIG. 25.

As shown in FIGS. 25 and 26, a quartz crystal substrate 2g according to the present embodiment is provided with a recess portion 32, which opens on a side of a second main surface 16b, between a first vibrating portion 3 and a second vibrating portion 5 and between the first vibrating portion 3 and the third vibrating portion 7, and is provided with a recess portion 33, which opens on a side of a second main surface 16b, between the second vibrating portion 5 and the third vibrating portion 7. That is, as shown in FIG. 26, a thin wall portion 22 is formed between the first vibrating portion 3 and the second vibrating portion 5 and between the first vibrating portion 3 and the third vibrating portion 7, and a thin wall portion 23 is formed between the second vibrating portion 5 and the third vibrating portion 7.

According to the present embodiment, the following effects can be obtained in addition to the effects of the first embodiment.

When the thin wall portions 22 and 23 are provided between the first vibrating portion 3 and the second vibrating portion 5, between the first vibrating portion 3 and the third vibrating portion 7, and between the second vibrating portion 5 and the third vibrating portion 7, it is possible to suppress interaction between the vibration of the first vibrating portion 3, the vibration of the second vibrating portion 5, and the vibration of the third vibrating portion 7.

The recess portions 32 and 33 may be formed on a side of a first main surface 16a, or may be holes penetrating the quartz crystal substrate 2g.

9. Ninth Embodiment

A schematic configuration of an oscillator 100 according to a ninth embodiment will be described with reference to FIGS. 27 and 28. In the oscillator 100 according to the ninth embodiment, any of the vibrating elements 1, 1a, 1b, 1c, 1d, 1e, 1f, and 1g described above can be used. Hereinafter, description will be performed while showing an example to which the vibrating element 1 described in the first embodiment is applied.

Figure 27:
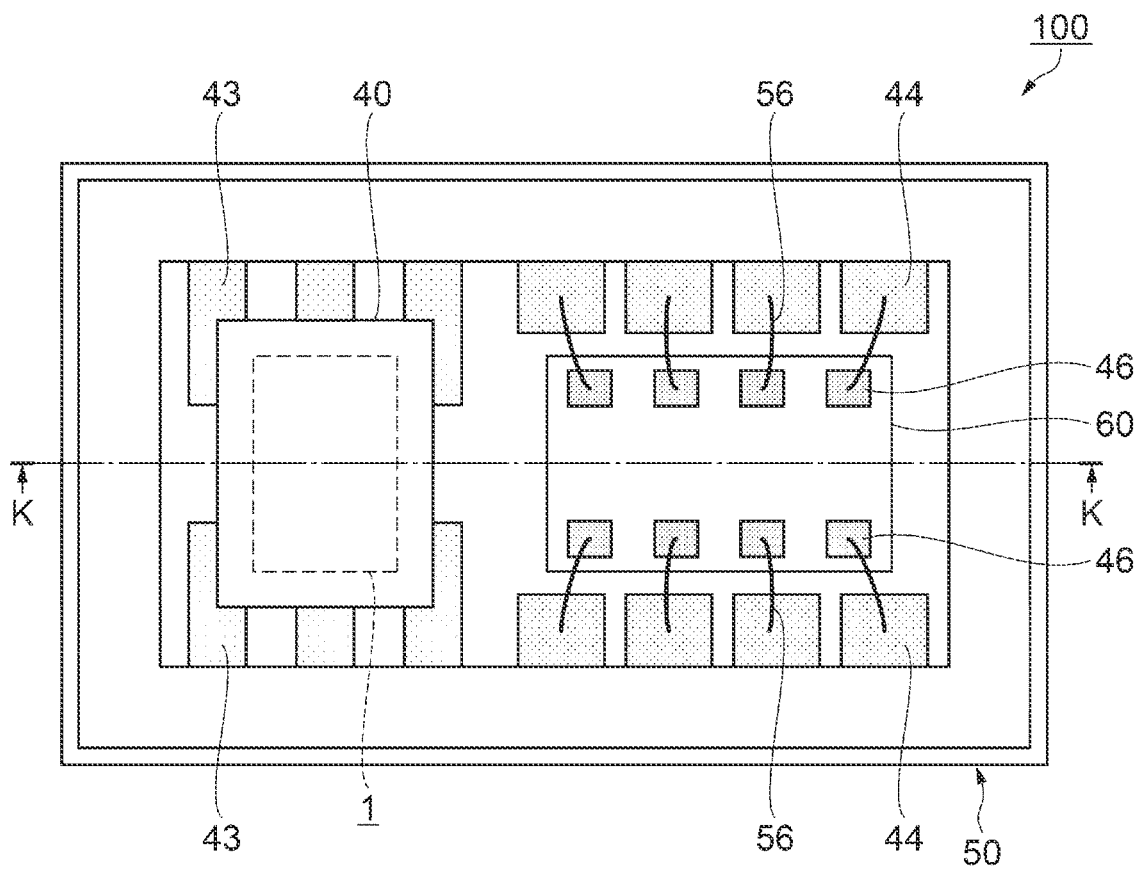
FIG. 27 is a plan diagram showing an oscillator to a ninth embodiment.

As shown in FIG. 27, the oscillator 100 includes a vibrator 40 equipped with the vibrating element 1, an IC chip 60 having oscillation circuits 61a, 61b, 61c for driving the vibrating element 1 and a control signal output circuit 63, a package body 50 for accommodating the vibrator 40 and the IC chip 60, and a lid member 57 made of glass, ceramics, metal, or the like.

Figure 28:
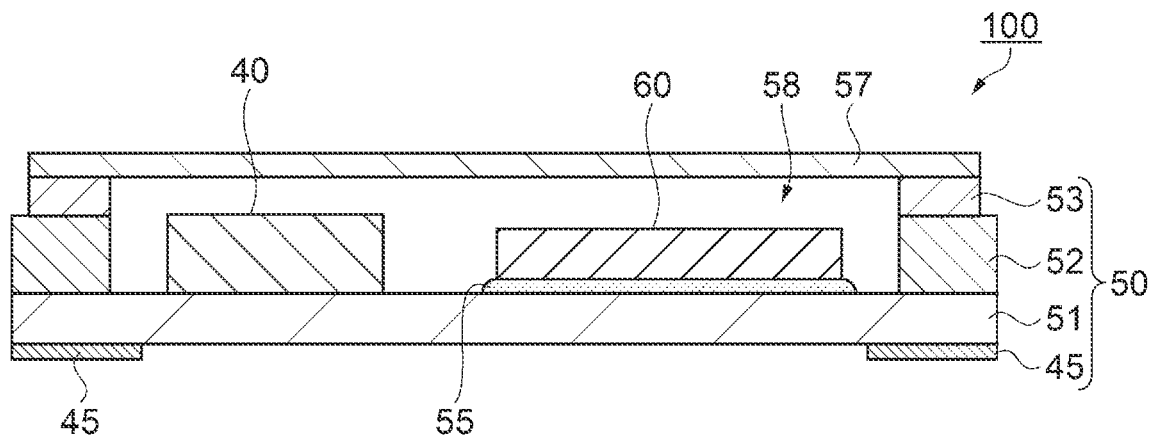
FIG. 28 is a cross-sectional diagram taken along a line K-K in FIG. 27.

As shown in FIG. 28, the package body 50 is formed by laminating mounting terminals 45, a first substrate 51, a second substrate 52, and a seal ring 53. Further, the package body 50 has a cavity 58 that opens upward. The inside of the cavity 58 accommodating the vibrator 40 and the IC chip 60 is hermetically sealed in a reduced pressure atmosphere or an inert gas atmosphere such as nitrogen by joining the lid member 57 with a seal ring 53.

The plurality of mounting terminals 45 are provided on an external bottom surface of the first substrate 51. Further, the mounting terminals 45 are electrically coupled to connection electrodes 43 and connection terminals 44 provided above the first substrate 51 via through electrodes and interlayer wirings (not shown).

The inside of the cavity 58 of the package body 50 is accommodated with vibrator 40 and the IC chip 60. The vibrator 40 is fixed to the connection electrodes 43 provided above the first substrate 51 via solder or a conductive adhesive. The IC chip 60 is fixed above the first substrate 51 via a joining member 55 such as an adhesive. Further, the cavity 58 is provided with the plurality of connection terminals 44. The connection terminals 44 are electrically coupled to connection terminals 46 provided above the IC chip 60 by bonding wires 56.

The IC chip 60 includes the first oscillation circuit 61a that oscillates the first vibrating element X1 and outputs a first oscillation signal, the second oscillation circuit 61b that oscillates the second vibrating element X2 and outputs a second oscillation signal, the third oscillation circuit 61c that oscillates the third vibrating element X3 and outputs a third oscillation signal, and the control signal output circuit 63 that outputs a control signal for controlling an oscillation frequency of the first oscillation signal based on the second oscillation signal and the third oscillation signal.

Next, a circuit configuration of the oscillator 100 will be described with reference to FIG. 29. In the following description, an example of the oscillator 100 will be described with reference to TCXO.

The control signal output circuit 63 is a circuit for outputting a set frequency $f_0$ from an output terminal 65 without depending on external temperature change of the oscillator 100 or while suppressing an influence of the external temperature change. The set frequency $f_0$ is an output frequency obtained when a reference voltage $V_0$ is applied to the first oscillation circuit 61a at a reference temperature $T_0$.

The first oscillation circuit 61a is electrically coupled to the pair of first excitation electrodes 4 of the first vibrating element X1 via the terminal 10. Similarly, the second oscillation circuit 61b for temperature detection is electrically coupled to the pair of second excitation electrodes 6 of the second vibrating element X2 via the terminal 11. The third oscillation circuit 61c for temperature detection is electrically coupled to the pair of third excitation electrodes 8 of the third vibrating element X3 via the terminal 12.

Figure 29:
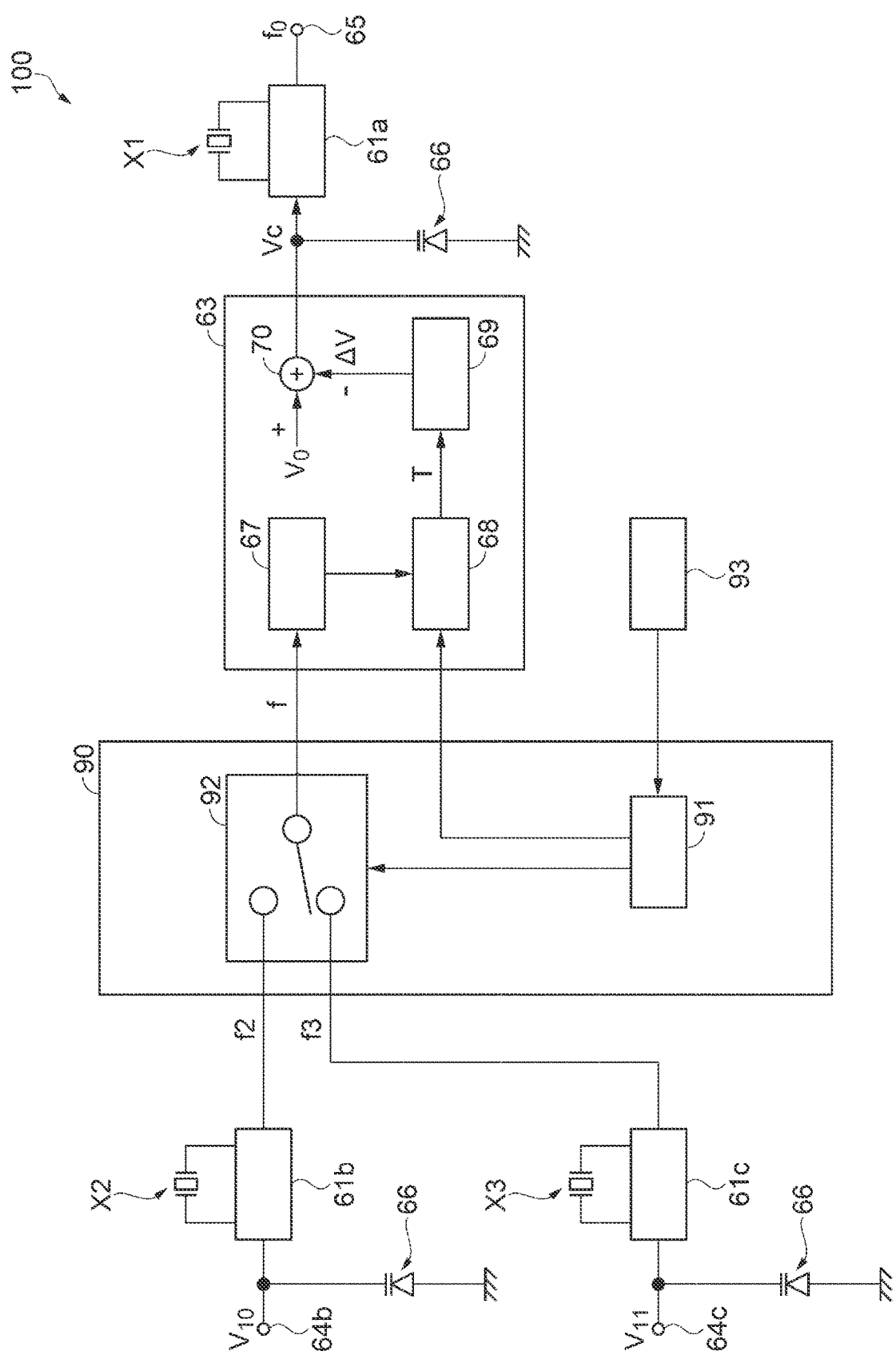
FIG. 29 is a block diagram showing a circuit configuration of the oscillator according to the ninth embodiment.

As shown in FIG. 29, between the first oscillation circuit 61a and the second and third oscillation circuits 61b and 61c, an output selection circuit 90 for selecting a frequency f to be output to the control signal output circuit 63, and the control signal output circuit 63 for estimating a temperature of the first vibrating element X1 based on the frequency f, which is an output signal output from the output selection circuit 90 and calculating a control voltage $V_c$ ($V_c=V_0-\Delta V$) as the control signal, in which the set frequency $f_0$ is obtained as the first oscillation signal in the first oscillation circuit 61a at this temperature, are provided.

The output selection circuit 90 includes a selection control unit 91 and an output selection unit 92. The selection control unit 91 is electrically coupled to the output selection unit 92, a temperature sensor 93, and a temperature estimation unit 68. The temperature sensor 93 detects an external temperature of the vibrating element 1. The selection control unit 91 selects the frequency f to be output to the control signal output circuit 63 from an oscillation frequency f2 as the second oscillation signal output from the second oscillation circuit 61b and an oscillation frequency f3 as the third oscillation signal output from the third oscillation circuit 61c based on the temperature detected by the temperature sensor 93. Further, the selection control unit 91 controls the output selection unit 92 so as to switch the frequency f which is the output signal output from the output selection circuit 90. The output selection unit 92 outputs one of the oscillation frequency f2 output from the second oscillation circuit 61b and the oscillation frequency f3 output from the third oscillation circuit 61c as the frequency f, which is the output signal output from the output selection circuit 90, to the control signal output circuit 63 based on the selection of the selection control unit 91.

A reference voltage $V_{10}$ is input from an input terminal 64b of the second oscillation circuit 61b to the second oscillation circuit 61b, and a reference voltage $V_{11}$ is input from an input terminal 64c of the third oscillation circuit 61c to the third oscillation circuit 61c, and the set frequency $f_0$ is output from the output terminal 65. Further, the reference voltages $V_{10}$ and $V_{11}$ stabilized by a varicap diode 66 and the control voltage $V_c$ are input to the first oscillation circuit 61a, the second oscillation circuit 61b, and the third oscillation circuit 61c, respectively.

The second vibrating element X2 and the third vibrating element X3 are used as a temperature detection unit. The oscillation frequency f2 as the second oscillation signal output from the second oscillation circuit 61b that drives the second vibrating element X2 is an output according to the temperature T of the second vibrating element X2 based on the frequency-temperature characteristic of the second vibrating element X2. Further, the oscillation frequency f3 as the third oscillation signal output from the third oscillation circuit 61c for driving the third vibrating element X3 is an output according to the temperature T of the third vibrating element X3 based on the frequency-temperature characteristic of the third vibrating element X3. In this way, it is possible to obtain the temperature T of the second vibrating element X2 and the temperature T of the third vibrating element X3.

The first vibrating element X1 is provided on the quartz crystal substrate 2 which is common to the second vibrating element X2 and the third vibrating element X3. Since the first vibrating element X1, the second vibrating element X2, and the third vibrating element X3 are coupled to each other and there is no difference in heat transfer time, it is possible to accurately estimate the temperature T of the first vibrating element X1 from the temperature T of the second vibrating element X2 and the temperature T of the third vibrating element X3.

Since the cutting angle of the second vibrating portion 5 and the cutting angle of the third vibrating portion 7 are different from each other, the frequency-temperature characteristic of the second vibrating element X2 and the frequency-temperature characteristic of the third vibrating element X3 are different from each other. Here, for example, when the temperature T of the first vibrating element X is estimated based on the temperature T of the second vibrating element X2 in a temperature range where the resolution of the temperature change with respect to the frequency change is higher in the second vibrating element X2 than the third vibrating element X3 and the temperature detection can be performed with high accuracy, and the temperature T of the first vibrating element X1 is estimated based on the temperature T of the third vibrating element X3 in a temperature range where the resolution of the temperature change with respect to the frequency change is higher in the third vibrating element X3 than the second vibrating element X2 and the temperature detection can be performed with high accuracy, it is possible to estimate the temperature T of the first vibrating element X1 with even higher accuracy.

The control signal output circuit 63 calculates the control voltage $V_c$ ($V_c=V_0-\Delta V$) for outputting the set frequency $f_0$ as the first oscillation signal from the first oscillation circuit 61a based on the temperature T of the second vibrating element X2 and the third vibrating element X3, which has the frequency-temperature characteristic having a larger frequency change amount.

Specifically, the control signal output circuit 63 includes a frequency detection unit 67 consisting of, for example, a frequency counter for measuring the frequency f output from the output selection circuit 90, a temperature estimation unit 68 for estimating the temperature T based on the frequency f measured in the frequency detection unit 67, a compensation voltage calculation unit 69 for calculating a compensation voltage $\Delta V$ based on the temperature T estimated in the temperature estimation unit 68, and an addition unit 70 for outputting the control voltage $V_c$, which is obtained by subtracting the compensation voltage $\Delta V$ calculated in the compensation voltage calculation unit 69 from the reference voltage $V_0$, to the first oscillation circuit 61a.

The temperature estimation unit 68 stores the frequency-temperature characteristic of the second oscillation circuit 61b expressed in the following Equation (1) and the frequency-temperature characteristic of the third oscillation circuit 61c expressed in Equation (2).

When the output selection unit 92 selects the oscillation frequency f2 output from the second oscillation circuit 61b as the frequency f to be output to the control signal output circuit 63, the temperature estimation unit 68 obtains the temperature T of the second vibrating element X2 based on the frequency-temperature characteristic of Equation (1) and the oscillation frequency f2 output from the second oscillation circuit 61b, so that it is possible to estimate the temperature T of the first vibrating element X1 from the temperature T of the second vibrating element X2.

When the output selection unit 92 selects the oscillation frequency f3 output from the third oscillation circuit 61c as the frequency f to be output to the control signal output circuit 63, the temperature estimation unit 68 obtains the temperature T of the third vibrating element X3 based on the frequency-temperature characteristic of Equation (2) and the oscillation frequency f3 output from the third oscillation circuit 61c, so that the temperature T of the first vibrating element X1 can be estimated from the temperature T of the third vibrating element X3.

$$f1 = f_{10}\{1+\alpha_2(T-T_{10})^3+\beta_2(T-T_{10})+\gamma_2\} \quad (1)$$

$$f2 = f_{11}\{1+\alpha_3(T-T_{11})^3+\beta_3(T-T_{11})+\gamma_3\} \quad (2)$$

Further, the compensation voltage calculation unit 69 includes, for example, a cubic function generator which is a temperature characteristic of the first oscillation circuit 61a, and is configured to obtain the compensation voltage $\Delta V$ based on the following Equations (3) to (5) and the temperature T.

$$\Delta V = V_0(\Delta f/f_0) \quad (3)$$

$$\Delta f/f_0 = \alpha_1(T-T_0)^3+\beta_1(T-T_0)+\gamma_1 \quad (4)$$

$$\Delta V = V_0\{\alpha_1(T-T_0)^3+\beta_1(T-T_0)+\gamma_1\} \quad (5)$$

Here, $\alpha_1$, $\beta_1$, and $\gamma_1$, $\alpha_2$, $\beta_2$, and $\gamma_2$, and $\alpha_3$, $\beta_3$, and $\gamma_3$ are constants unique to the first oscillation circuit 61a, the second oscillation circuit 61b, and the third oscillation circuit 61c, respectively, and are obtained by measuring the output frequency by changing the temperature and the reference voltage in various ways. $\Delta f=f-f_0$, $f_{10}$ is the output frequency obtained when the reference voltage $V_{10}$ is applied at the reference temperature $T_{10}$ in the second oscillation circuit 61b, and $f_{11}$ is an output frequency obtained when the reference voltage $V_{11}$ is applied at a reference temperature $T_{11}$ in the third oscillation circuit 61c.

When the control voltage $V_{10}$ is input to the input terminal 64b of the second oscillation circuit 61b, the second oscillation circuit 61b oscillates due to the thickness slip vibration of a fundamental mode at the oscillation frequency f1 obtained in the above-described Equation (1) based on the temperature T of the second vibrating element X2. When the control voltage $V_{11}$ is input to the input terminal 64c of the third oscillation circuit 61c, the third oscillation circuit 61c oscillates due to the thickness slip vibration of a fundamental mode at the oscillation frequency f2 obtained in the above-described Equation (2) based on the temperature T of the third vibrating element X3.

The output selection circuit 90 outputs one of the oscillation frequency f2 as the second oscillation signal output from the second oscillation circuit 61b and the oscillation frequency f3 as the third oscillation signal output from the third oscillation circuit 61c, as the frequency f which is the output signal output from the output selection circuit 90, to the control signal output circuit 63 based on the temperature detected by the temperature sensor 93.

The frequency f is input to the temperature estimation unit 68 via the frequency detection unit 67. The temperature estimation unit 68 obtains the temperature T of the second vibrating element X2 or the temperature T of the third vibrating element X3 based on the selection of the output selection unit 92 of the output selection circuit 90, and estimates the temperature T of the first vibrating element X1. Further, the compensation voltage calculation unit 69 calculates the compensation voltage ΔV based on the temperature T obtained by the temperature estimation unit 68, and applies the control voltage $V_c$ as the control signal via the addition unit 70 to the first oscillation circuit 61a. The first oscillation circuit 61a vibrates due to the thickness slip vibration at a frequency that is the first oscillation signal corresponding to the temperature T of the first vibrating element X1 and the control voltage $V_c$, that is, the set frequency $f_0$.

That is, at the temperature T, the first oscillation circuit 61a causes the oscillation frequency to be deviated from the set frequency $f_0$ along the frequency-temperature characteristic of the first oscillation circuit 61a by the difference $(T-T_0)$ from the reference temperature $T_0$. However, since the control voltage $V_c$ lower or higher than the reference voltage $V_0$ by the amount corresponding to the difference is applied to the first oscillation circuit 61a, the output frequency that offsets the difference, that is, the set frequency $f_0$ can be obtained.

Since it is possible to adjust the frequency-temperature characteristic of the second vibrating element X2 and the frequency-temperature characteristic of the third vibrating element X3 to a characteristic suitable for temperature detection while causing the frequency-temperature characteristic of the first vibrating element X1 to be a characteristic suitable for the oscillation signal output, the oscillator 100 according to the present embodiment can quickly and highly accurately perform temperature compensation on the set frequency $f_0$ output from the first vibrating element X1 based on the oscillation frequency f2 of the second vibrating element X2 and the oscillation frequency f3 of the third vibrating element X3. Therefore, it is possible to obtain a highly accurate oscillator 100 with a stable set frequency $f_0$.

Further, it is possible to cause the frequency-temperature characteristic of the second vibrating element X2 and the frequency-temperature characteristic of the third vibrating element X3 to be different characteristics. When the temperature T of the first vibrating element X1 is estimated based on the temperature T of the vibrating element, which has the frequency-temperature characteristic having a larger frequency change amount at a temperature detected by the temperature sensor 93, between the second vibrating element X2 and the third vibrating element X3, it is possible to estimate the temperature T of the first vibrating element X1 with even higher accuracy. Therefore, it is possible to obtain a highly accurate oscillator 100 having the set frequency $f_0$ that is even more stable.

10. Tenth Embodiment

A circuit configuration of an oscillator 100a according to a tenth embodiment will be described with reference to FIGS. 30 and 31. The same components as in the ninth embodiment are designated by the same reference symbols, and duplicate description will be omitted.

In the present embodiment, the sum or difference between an oscillation frequency f2 of a second vibrating element X2 and an oscillation frequency f3 of a third vibrating element X3 is obtained, and a frequency f calculated in this way is used as a temperature detection signal.

Figure 30:
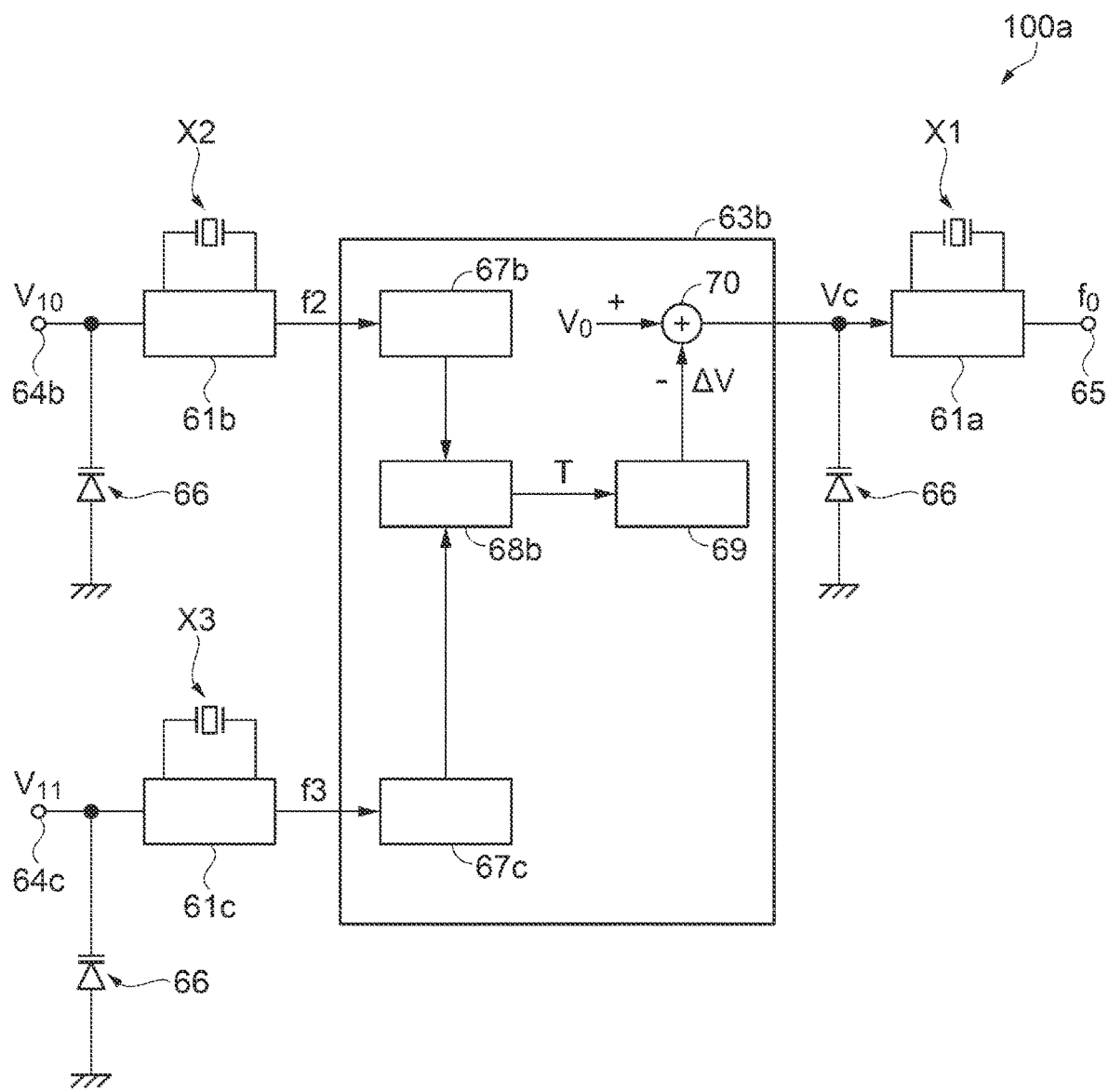
FIG. 30 is a block diagram showing a circuit configuration of an oscillator according to a tenth embodiment.

As shown in FIG. 30, between a first oscillation circuit 61a and second and third oscillation circuits 61b and 61c, a control signal output circuit 63b is provided for estimating the temperature of the first vibrating element X1 based on the oscillation frequency f2 as a second oscillation signal output from the second oscillation circuit 61b of the second vibrating element X2 and the oscillation frequency f3 as a third oscillation signal output from the third oscillation circuit 61c of the third vibrating element X3, and calculating a control voltage $V_c$ ($V_c=V_0-\Delta V$) as a control signal at which a set frequency $f_0$ is obtained as a first oscillation signal by the first oscillation circuit 61a at this temperature.

The control signal output circuit 63b includes frequency detection units 67b and 67c, a temperature estimation unit 68b, a compensation voltage calculation unit 69, and an addition unit 70.

The oscillation frequency f2 output from the second oscillation circuit 61b is input to a temperature estimation unit 68b via the frequency detection unit 67b. The oscillation frequency f3 output from the third oscillation circuit 61c is input to the temperature estimation unit 68b via the frequency detection unit 67c.

The temperature estimation unit 68b calculates a difference (f3−f2) between the oscillation frequency f2 and the oscillation frequency f3, and estimates a temperature T of the first vibrating element X1 based on the frequency difference (f3−f2) obtained by the calculation and relational data between the frequency difference (f3−f2) and the temperature T.

FIG. 31 shows an example of the relational data between the frequency difference (f3−f2) and the temperature T, which obtained by subtracting a cubic curve, which is a frequency-temperature characteristic of the third vibrating element X3, from a cubic curve which is a frequency-temperature characteristic of the second vibrating element X2. As can be seen from FIG. 31, the calculated frequency difference (f3−f2) has a relationship which is roughly proportional to the temperature T.

The temperature estimation unit 68b includes a storage unit that stores the relational data between the frequency difference (f3−f2) and the temperature T, a calculation unit that calculates the difference (f3−f2) between the oscillation frequency f2 and the oscillation frequency f3, and a reading unit that reads the temperature T corresponding to the frequency difference (f3−f2) from the relational data in the storage unit (not shown).

The temperature T may be obtained by, instead of calculating the difference (f3−f2) between the oscillation frequencies f2 and f3, obtaining the sum (f2+f3) of the oscillation frequencies f2 and f3, and referring to the relational data between the sum of frequencies (f2+f3) and the temperature T. Further, the temperature T may be obtained by, instead of calculating the difference between the oscillation frequency f2 and the oscillation frequency f3, obtaining a difference between a voltage-converted V2 of the oscillation frequency f2 and a voltage-converted V3 of the oscillation frequency f3, and referring to the relational data between the voltage difference (V3−V2) and the temperature T.

Since it is possible to adjust the frequency-temperature characteristic of the second vibrating element X2 and the frequency-temperature characteristic of the third vibrating element X3 to a characteristic suitable for temperature detection while setting the frequency-temperature characteristic of the first vibrating element X1 as a characteristic suitable for the oscillation signal output, the oscillator 100a according to the present embodiment can quickly and highly accurately perform temperature compensation on the set frequency $f_0$ output from the first vibrating element X1 based on the oscillation frequency f2 of the second vibrating element X2 and the oscillation frequency f3 of the third vibrating element X3. Therefore, it is possible to obtain a highly accurate oscillator 100a with the set frequency $f_0$ that is stable.

Further, it is possible to cause the frequency-temperature characteristic of the second vibrating element X2 and the frequency-temperature characteristic of the third vibrating element X3 to be different characteristics. When the temperature T of the first vibrating element X1 is estimated based on the sum or difference of the oscillation frequency f2 of the second vibrating element X2 and the oscillation frequency f3 of the third vibrating element X3, it is possible to estimate the temperature T of the first vibrating element X1 with even higher accuracy. Therefore, it is possible to obtain a highly accurate oscillator 100a with the set frequency $f_0$ that is even more stable.

What is claimed is:

1. A vibrating element comprising:
a quartz crystal substrate having a first vibrating portion, a second vibrating portion disposed on one side of the first vibrating portion in a first direction, and a third vibrating portion disposed on one side of the first vibrating portion in the first direction and aligned with the second vibrating portion along a second direction orthogonal to the first direction;
a pair of first excitation electrodes formed on both main surfaces of the quartz crystal substrate in the first vibrating portion;
a pair of second excitation electrodes formed to sandwich the second vibrating portion in a thickness direction of the quartz crystal substrate in the second vibrating portion; and
a pair of third excitation electrodes formed to sandwich the third vibrating portion in the thickness direction of the quartz crystal substrate in the third vibrating portion, wherein
at least one second excitation electrode of the pair of second excitation electrodes is formed into a first inclined surface inclined with respect to both the main surfaces,
at least one third excitation electrode of the pair of third excitation electrodes is formed into a second inclined surface inclined with respect to both the main surfaces, and
the second inclined surface is inclined with respect to the first inclined surface.

2. The vibrating element according to claim 1, wherein both the main surfaces, the first inclined surface, and the second inclined surface have cutting angles which are different from each other.

3. The vibrating element according to claim 1, wherein a cutting angle of the first inclined surface is smaller than a cutting angle of both the main surfaces, and
a cutting angle of the second inclined surface is larger than the cutting angle of both the main surfaces.

4. The vibrating element according to claim 1, wherein the first vibrating portion, the second vibrating portion, and the third vibrating portion have frequency-temperature characteristics which are different from each other.

5. The vibrating element according to claim 4, wherein the frequency-temperature characteristics of the second vibrating portion and the third vibrating portion have a larger frequency change amount than the frequency-temperature characteristic of the first vibrating portion.

6. The vibrating element according to claim 1, wherein the first inclined surface and the second inclined surface are inclined so that a thickness of the second vibrating portion and a thickness of the third vibrating portion become thinner as approaching each other.

7. The vibrating element according to claim 1, wherein the first inclined surface and the second inclined surface are inclined so that a thickness of the second vibrating portion and a thickness of the third vibrating portion become thinner as being separated from each other.

8. The vibrating element according to claim 1, wherein the second vibrating portion has a surface parallel to the first inclined surface on a back side of the first inclined surface, and
the third vibrating portion has a surface parallel to the second inclined surface on a back side of the second inclined surface.

9. The vibrating element according to claim 1, wherein the first vibrating portion has a projection portion formed on at least one main surface.

10. The vibrating element according to claim 1, wherein the vibrating element has a fixing portion for fixing the vibrating element to a package at an end portion in the first direction.

11. The vibrating element according to claim 10, wherein the fixing portion is provided at the end portion on a side of the second vibrating portion and the third vibrating portion.

12. The vibrating element according to claim 1, further comprising:
at least one of a through hole and a thin wall portion between the second vibrating portion and the third vibrating portion.

13. The vibrating element according to claim 1, further comprising:
at least one of a through hole and a thin wall portion between the first vibrating portion, the second vibrating portion, and the third vibrating portion.

14. An oscillator comprising:
the vibrating element according to claim 1;
a first oscillation circuit that is electrically coupled to a first excitation electrode to output a first oscillation signal;
a second oscillation circuit that is electrically coupled to a second excitation electrode to output a second oscillation signal;
a third oscillation circuit that is electrically coupled to a third excitation electrode to output a third oscillation signal; and
a control signal output circuit to which at least one of the second oscillation signal and the third oscillation signal is input and that outputs a control signal for controlling an oscillation frequency of the first oscillation signal based on the input signal.

15. The oscillator according to claim 14, further comprising:
a temperature sensor;
an output selection circuit to which the second oscillation signal and the third oscillation signal are input and that selectively outputs the second oscillation signal or the third oscillation signal based on a temperature detection result of the temperature sensor, wherein the control signal output circuit outputs the control signal based on the output signal of the output selection circuit.

16. The oscillator according to claim 15, wherein
the output selection circuit selects and outputs one of the second oscillation signal and the third oscillation signal, which has a frequency-temperature characteristic having a larger frequency change amount at a temperature detected by the temperature sensor.

* * * * *